United States Patent
Barbato

(10) Patent No.: US 10,636,814 B2
(45) Date of Patent: Apr. 28, 2020

(54) 3D MEMORY DEVICE

(71) Applicant: Trinandable S.r.l, Milan (IT)

(72) Inventor: Sabrina Barbato, Turate (IT)

(73) Assignee: Trinandable, S.r.l., Milan (IT)

( * ) Notice: Subject to any disclaimer, the term of this patent is extended or adjusted under 35 U.S.C. 154(b) by 0 days.

(21) Appl. No.: 16/529,648

(22) Filed: Aug. 1, 2019

(65) Prior Publication Data

US 2019/0355746 A1 Nov. 21, 2019

Related U.S. Application Data

(62) Division of application No. 15/899,078, filed on Feb. 19, 2018.

(30) Foreign Application Priority Data

Feb. 21, 2017 (IT) .................. 102017000019392

(51) Int. Cl.
| | | |
|---|---|---|
| *H01L 27/11582* | (2017.01) | |
| *H01L 27/11556* | (2017.01) | |
| *H01L 27/11519* | (2017.01) | |
| *H01L 27/11565* | (2017.01) | |
| *H01L 27/1157* | (2017.01) | |

(52) U.S. Cl.
CPC .... *H01L 27/11582* (2013.01); *H01L 27/1157* (2013.01); *H01L 27/11519* (2013.01); *H01L 27/11556* (2013.01); *H01L 27/11565* (2013.01)

(58) Field of Classification Search
CPC ......... H01L 27/11578; H01L 27/11556; H01L 27/11582; H01L 27/0688; H01L 27/11524; H01L 27/11565; H01L 21/02233; H01L 21/8221; H01L 27/105; H01L 27/115; H01L 27/1157; H01L 29/792; H01L 29/7926; H01L 27/11519; G11C 16/0483; G11C 16/08; G11C 5/02
USPC .......................................................... 257/314
See application file for complete search history.

(56) References Cited

U.S. PATENT DOCUMENTS

| | | |
|---|---|---|
| 9,230,984 B1 | 1/2016 | Takeguchi |
| 2008/0073694 A1 | 3/2008 | Willer |
| 2009/0296476 A1 | 12/2009 | Shin et al. |

(Continued)

FOREIGN PATENT DOCUMENTS

WO 2016148748 A1 9/2016

*Primary Examiner* — Caleen O Sullivan

(74) *Attorney, Agent, or Firm* — John M. Janeway; Janeway Patent Law, PLLC

(57) ABSTRACT

A 3D memory device, comprising a plurality of rows of strings of memory cells, each row of strings of memory cells comprising an array of strings of memory cells extending along a first direction, the rows following one another along a second direction. Each string of memory cells comprises a stack of memory cells, and the strings of memory cells of the stack extend in a third direction from a first end to a second end. A source region is provided at the second end of the strings of memory cells. Consecutive rows of strings of memory cells along the second direction are spaced apart from each other of a pitch. Between pairs of strings of a row of memory cells along the second direction there is formed a slit extending in the third direction from the first end down to the source region. The slit has dimension, along the second direction, smaller than, equal to or greater than the pitch, sufficient to the formation, in the slit, of an electrical contact to the source region.

4 Claims, 29 Drawing Sheets

(56) References Cited

U.S. PATENT DOCUMENTS

2014/0014889 A1  1/2014  Shim et al.
2016/0126248 A1  5/2016  Rabkin

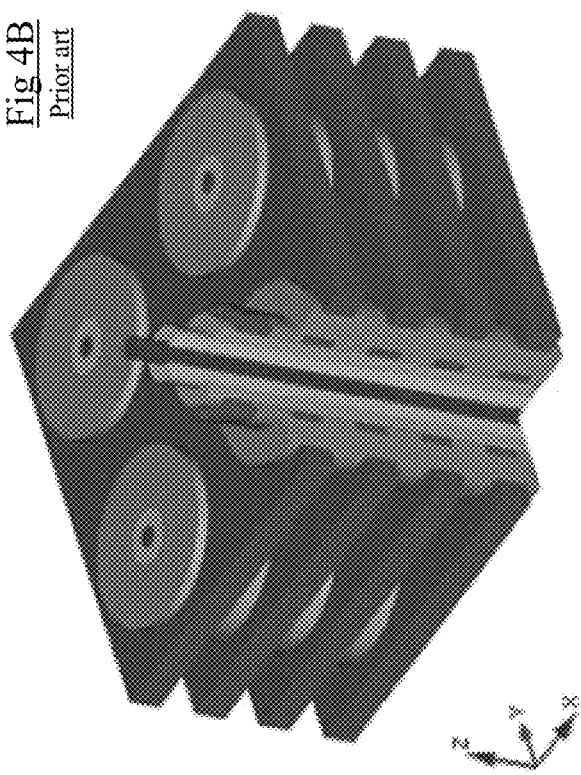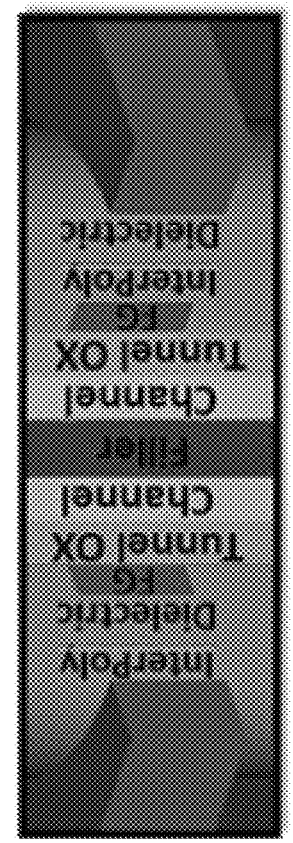
Fig 4A
Prior art
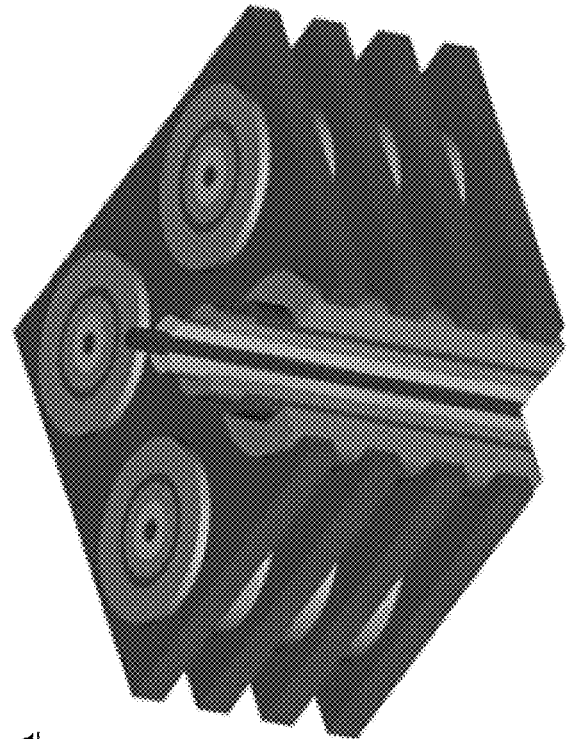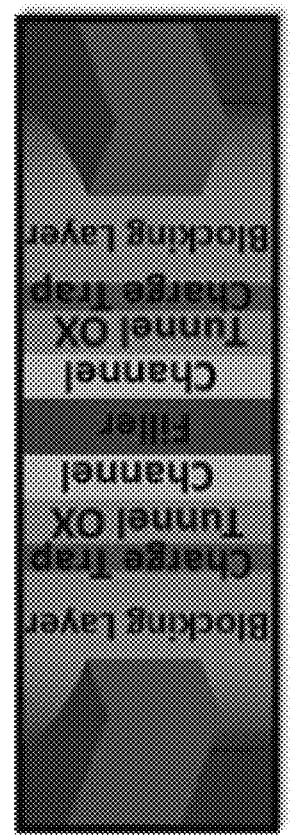
Fig 4B
Prior art

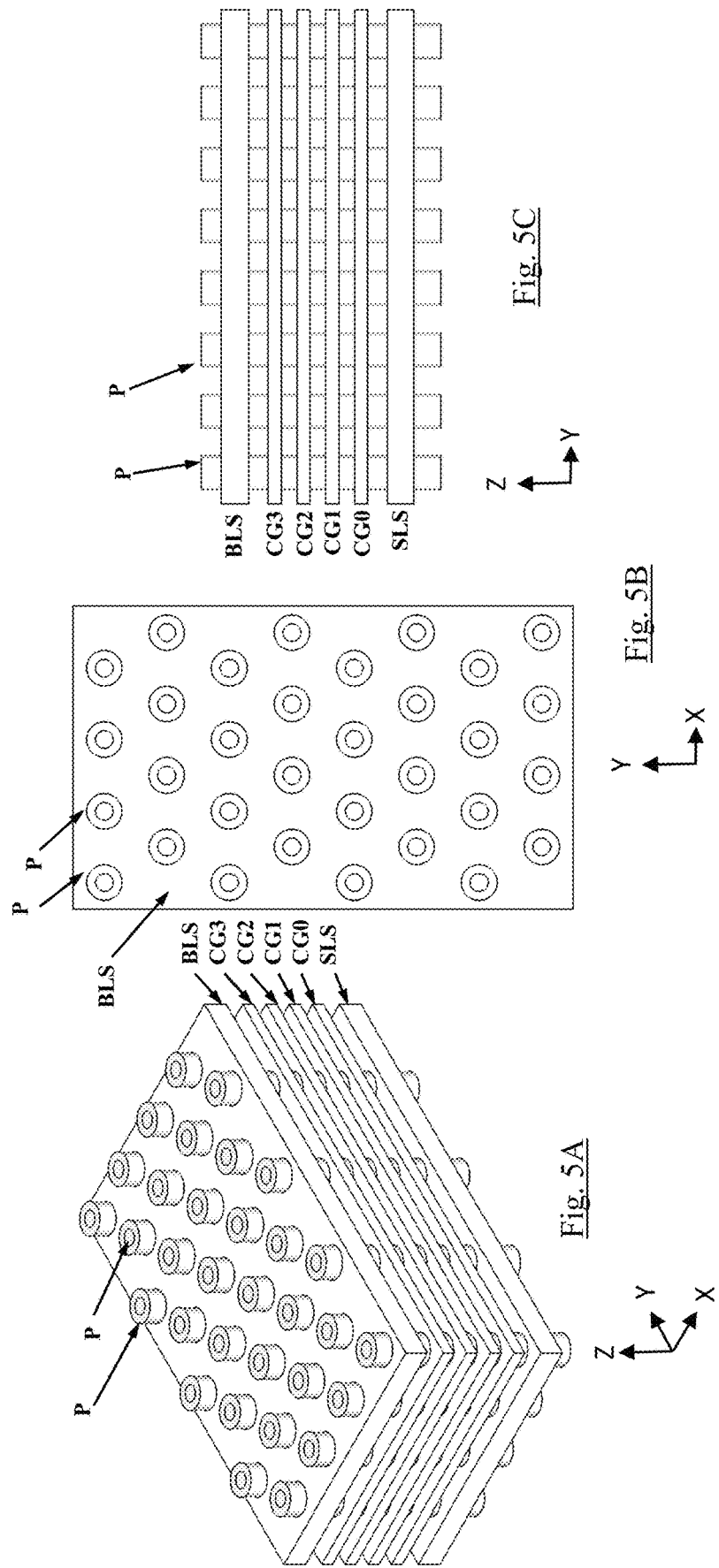

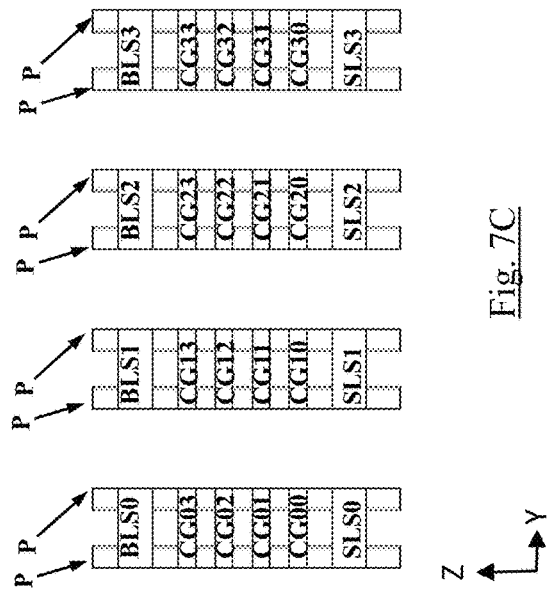
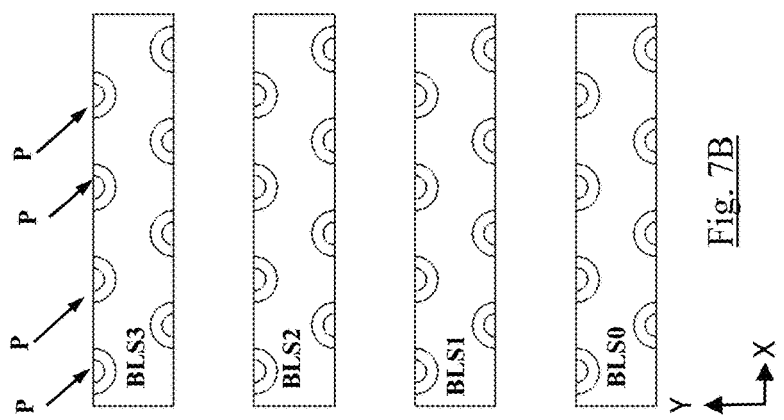
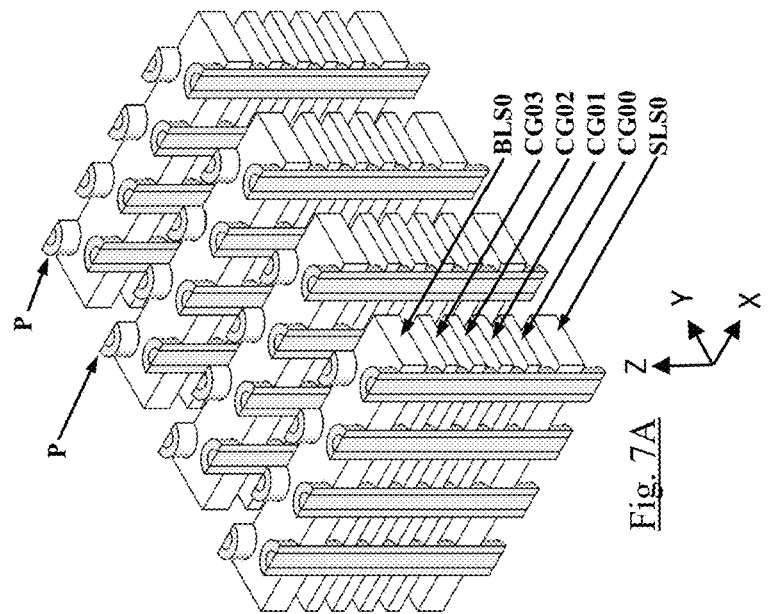

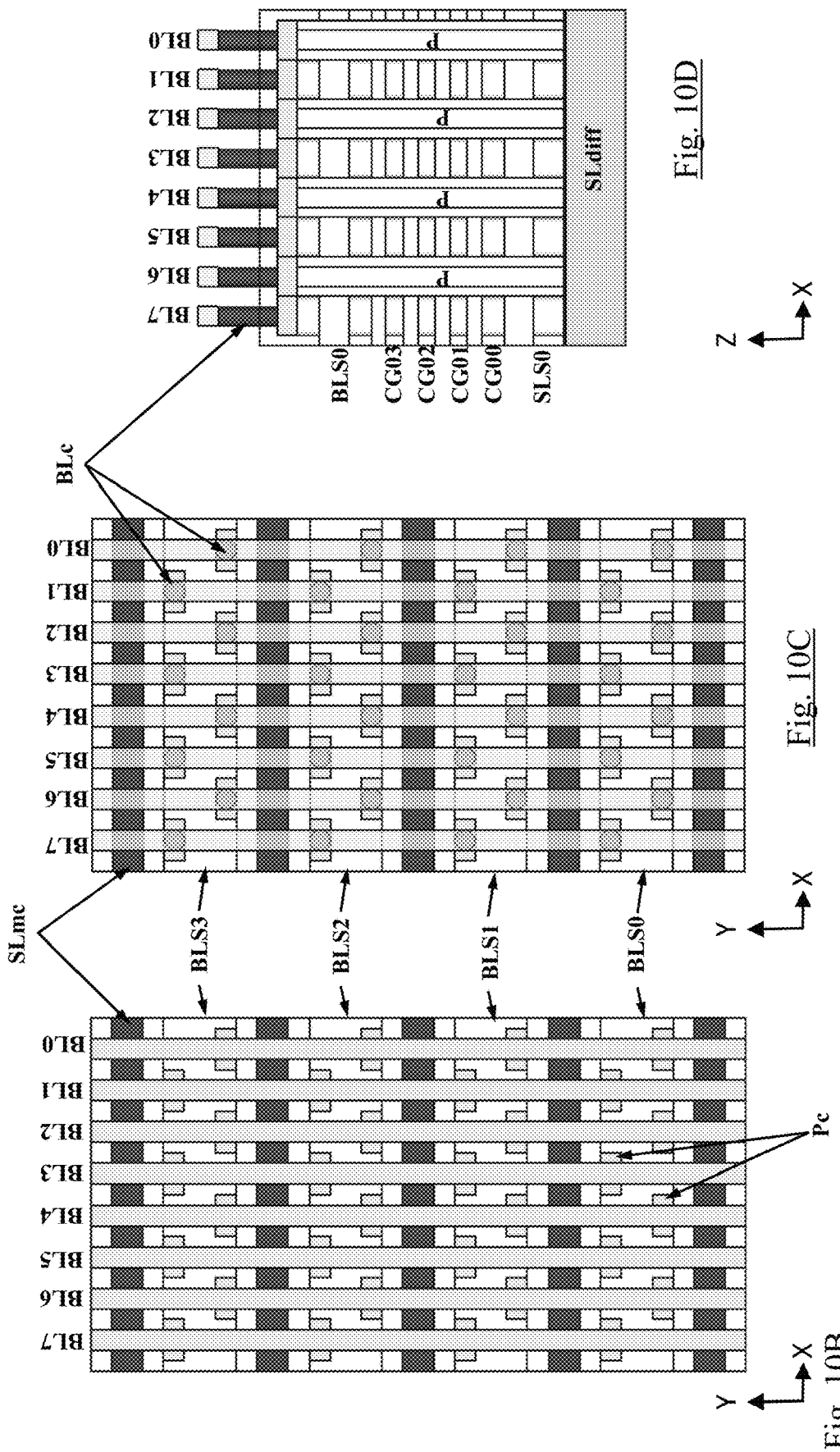

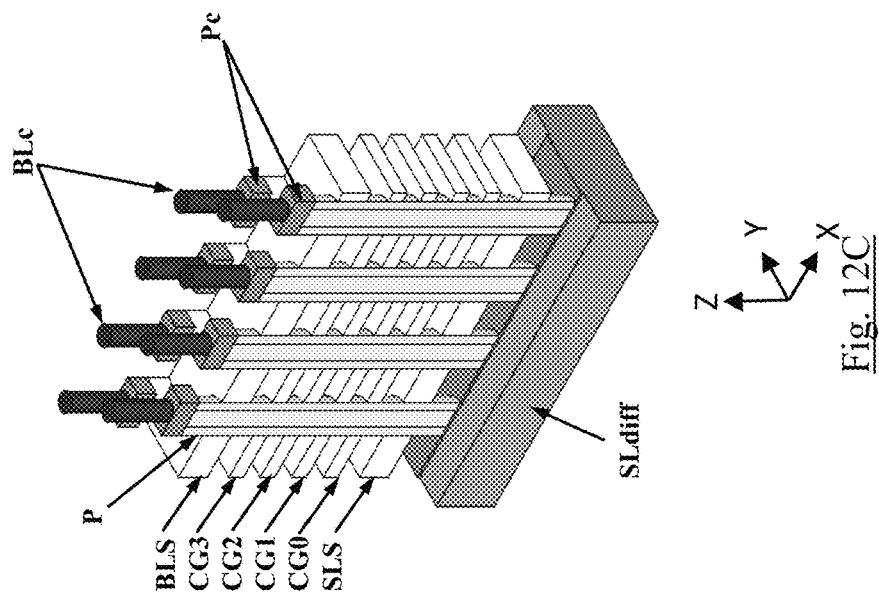
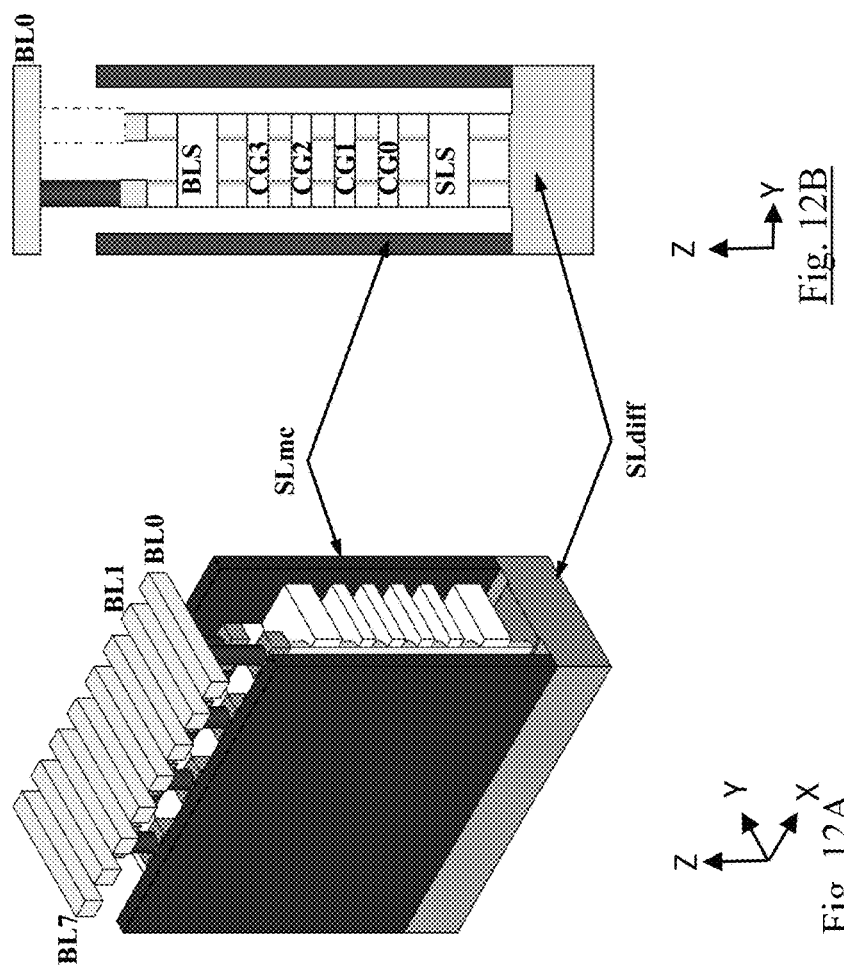
Fig. 12C
Fig. 12B
Fig. 12A

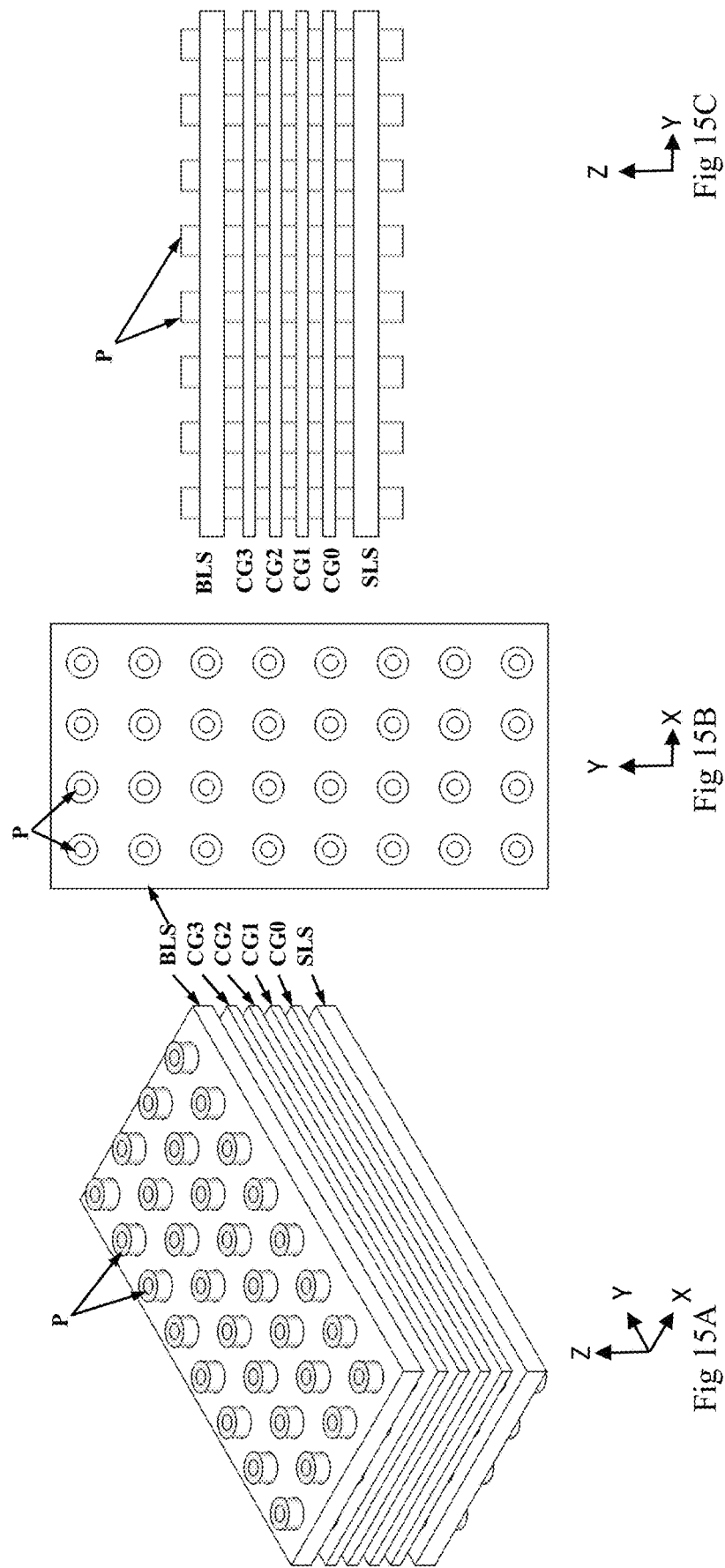

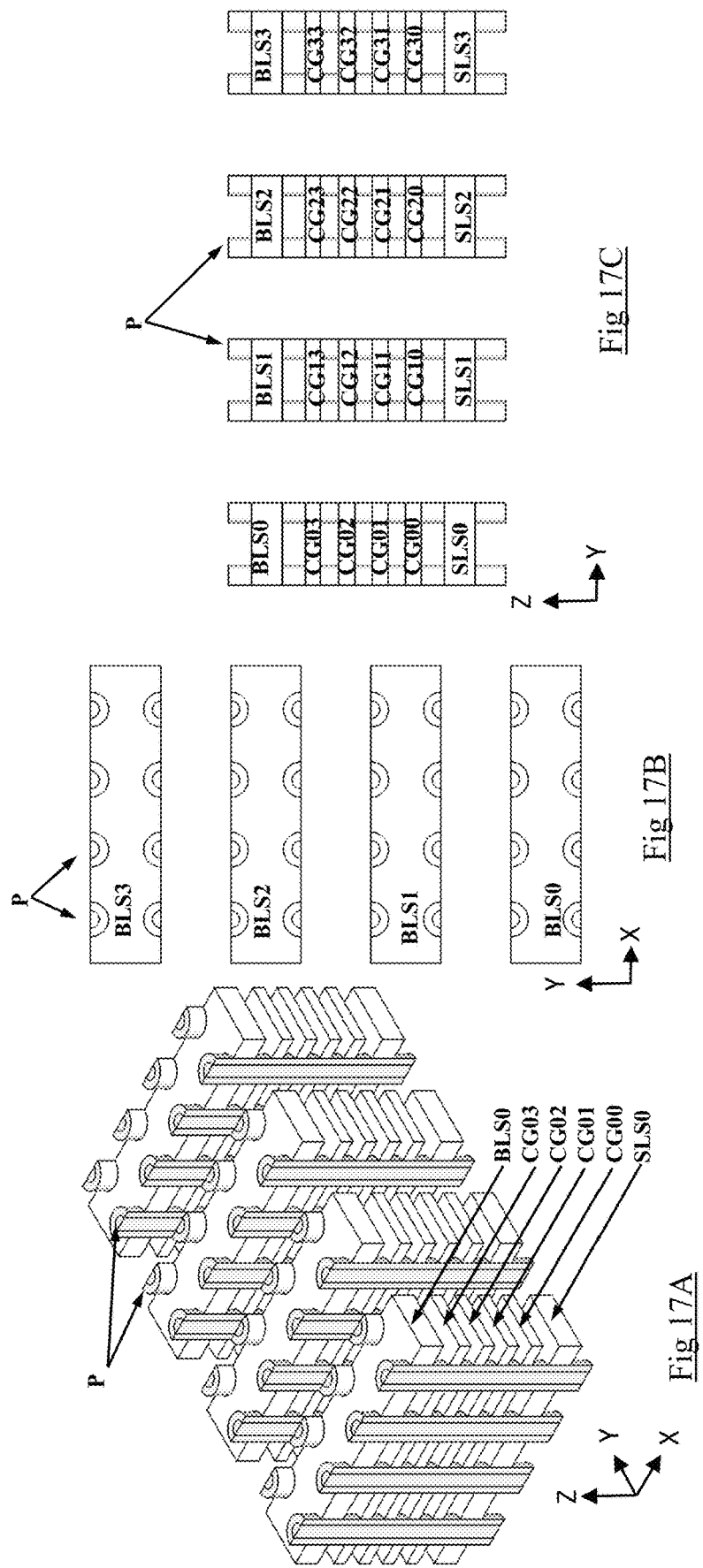

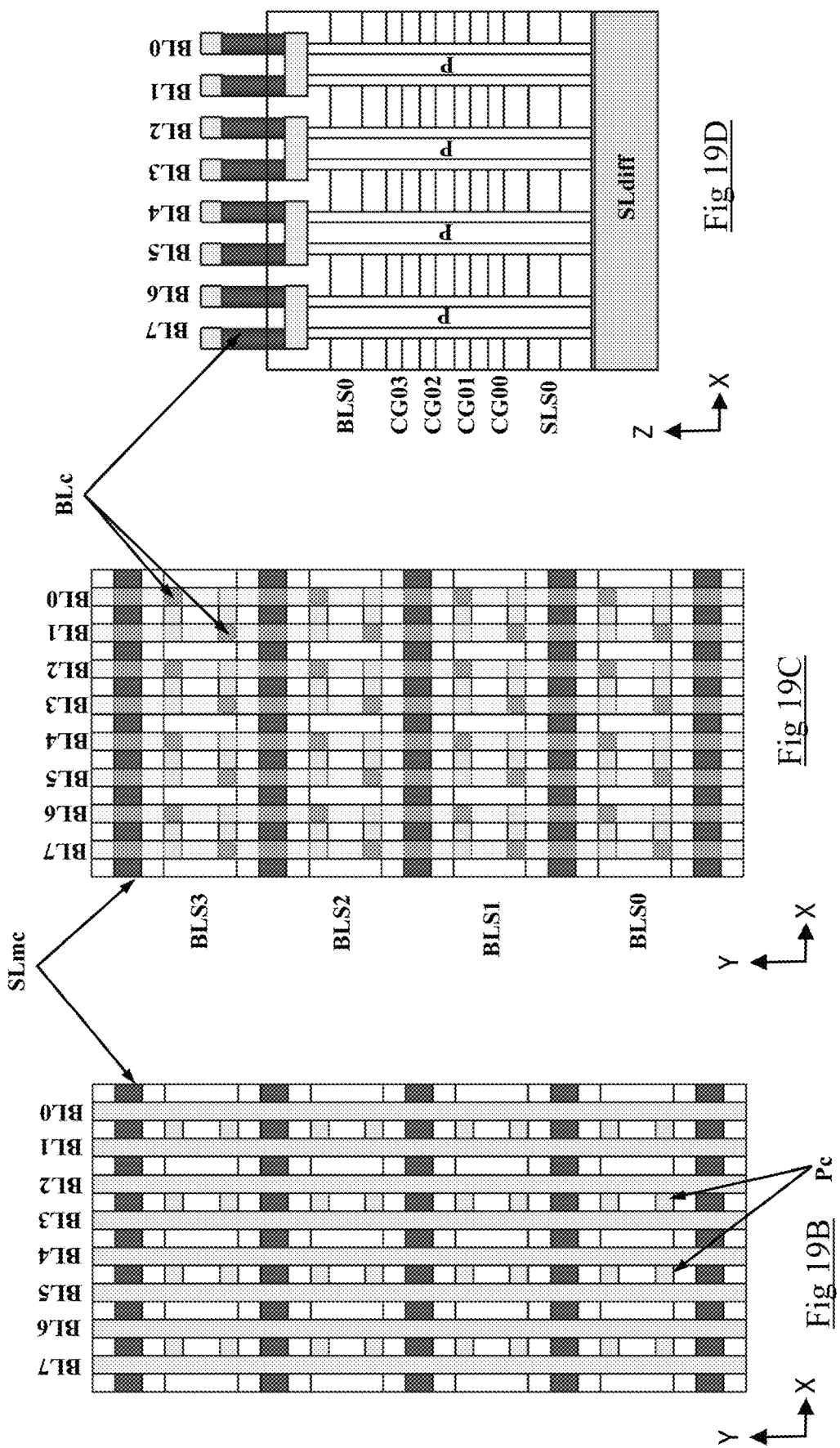

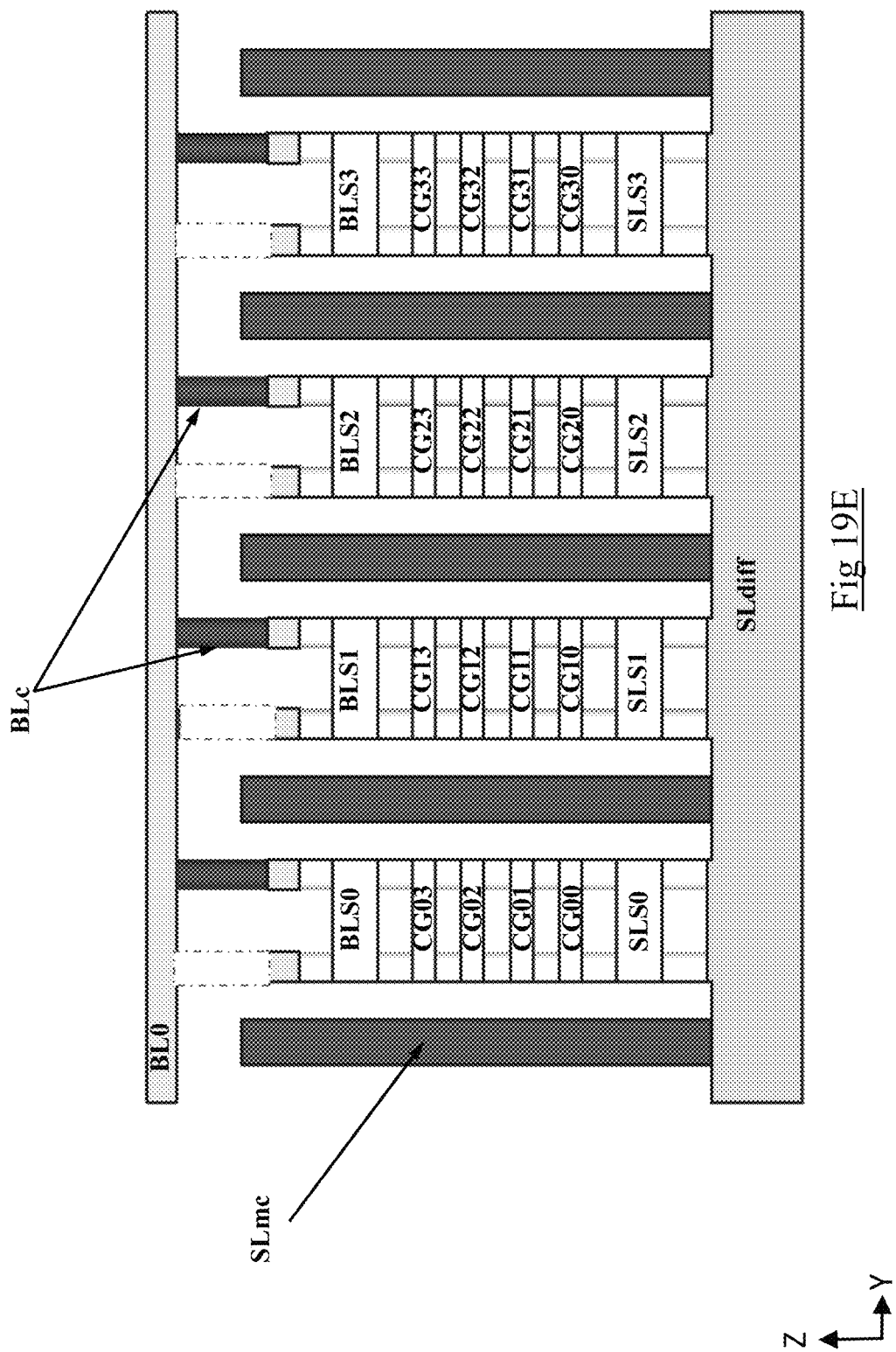

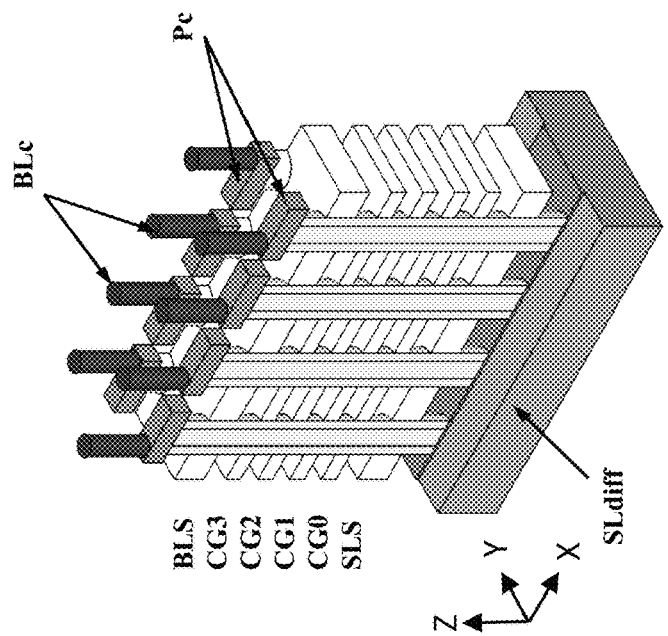
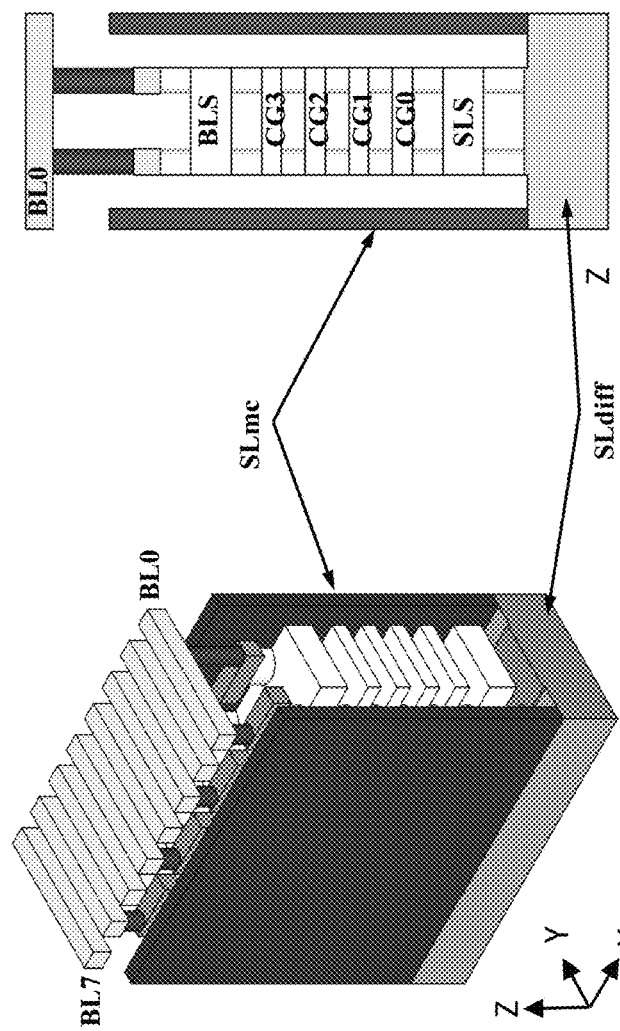
Fig 21A   Fig 21B   Fig 21C

3D MEMORY DEVICE

BACKGROUND

Technical Field

The solution proposed in this document refers generally to the field of solid state devices, in particular semiconductor devices, and specifically to the field of semiconductor memories. More specifically, the solution proposed in this document refers to the field of the so-called "three-dimensional" ("3D") semiconductor memories.

Overview of the State of the Art

In the field of non-volatile semiconductor memories (memory devices capable of retaining the data stored therein even in the absence of an energy supply source), 3D semiconductor memories ("3D memories") represent an evolution of the traditional "two-dimensional" semiconductor memories ("2D memories", in which the memory cells are formed as a single layer on a substrate of semiconductor material), which allows to overcome the limits set by the 2D structure to further increments of the integration scale, and therefore allows further increases in the data storage capacity per unit area.

Examples of non-volatile 3D semiconductor memory devices with a NAND architecture (in which there are groups of memory cells connected in series to form strings of memory cells) are described both in non-patent literature and in various patents/patent applications, among which for example U.S. Pat. Nos. 8,644,046, 9,129,861, US 2015/0279852, US 2014/0264532, U.S. Pat. Nos. 9,177,966, 9,218,874.

SUMMARY OF THE SOLUTION PROPOSED IN THIS DOCUMENT

The Applicant has observed that the known memory cell array architectures, such as the one shown in FIG. 9 of U.S. Pat. No. 9,218,874, have room for improvement in terms of structural compactness, with consequent improvement in the data storage capacity per unit of area.

One object of the solution proposed in this document is to propose a memory cell array architecture for a 3D semiconductor memory which is structurally more compact than known architectures, which allows further increases in the data storage capacity per unit area.

According to an aspect of the solution proposed in this document, a three-dimensional, 3D, memory device is proposed, comprising:

a plurality of rows of strings of memory cells, each row of strings of memory cells comprising an alignment of strings of memory cells extending along a first direction, said rows following one another along a second direction, wherein each string of memory cells comprises a stack of memory cells, said strings of memory cells of the stack extending in a third direction from a first end to a second end;

a source region at the second end of the strings of memory cells;

wherein consecutive rows of memory cells strings which are consecutive along said second direction are spaced apart from each other of a pitch.

Between consecutive pairs of said rows of memory cell strings along said second direction a slit is formed, said slit extending in said third direction from said first end to said source region.

Said slit has a dimension, along said second direction, smaller, equal to or greater than said pitch, sufficient to form, in said slit, an electrical contact to the source region.

In preferred embodiments, said slit has a dimension, along said second direction, substantially equal to said pitch of consecutive rows of strings of memory cells consecutive along said second direction.

For example, said memory cell strings may have a semi-cylindrical shape with an axis along said third direction.

In some embodiments, strings of memory cells belonging to consecutive rows of strings of memory cells of said plurality which are consecutive along said second direction are aligned along said second direction.

In other embodiments, strings of memory cells belonging to consecutive rows of strings of memory cells of said plurality which are consecutive along said second direction are disposed at "zig-zag" along said second direction.

The 3D memory device may also include:

a plurality of stacked word lines stacked along said third direction, wherein the plurality of word lines surrounds the strings of memory cells;

source line selectors associated with the memory cell strings to selectively electrically connect/disconnect the strings of memory cells to the source region;

a plurality of bit lines extending along said second direction, and bit line selectors stacked above the plurality of word lines, for selectively electrically connecting/disconnecting each of the strings of memory cells to a respective bit line of said plurality of bit lines.

The 3D memory device may further comprise electrical contacts for the electrical contact between each of the memory cell strings and said respective bit line of said plurality of bit lines.

Each bit line of said plurality of bit lines may preferably contact respective strings of memory cells belonging to rows of memory cell strings alternated along said second direction.

According to a second aspect of the solution proposed in this document, a method is proposed for realizing a three-dimensional, 3D, memory device, comprising:

realizing a plurality of rows of strings of memory cells, each row of strings of memory cells comprising an alignment of strings of memory cells extending along a first direction, said rows following one another along a second direction, wherein each string of memory cells comprises a stack of memory cells, said strings of memory cells of the stack extending in a third direction from a first end to a second end, wherein consecutive rows of memory cell strings which are consecutive along said second direction are spaced apart from one another of a pitch;

realizing a source region at the second end of the strings of memory cells;

forming, between pairs of said consecutive rows of memory cell strings which are consecutive along said second direction, a slit extending in said third direction from said first end to said source region, wherein said slit has a dimension along said second direction smaller than, equal to or greater than said pitch, sufficient for forming, in said slit, an electrical contact to the source region, and realizing said electrical contact to the source region.

In particular:

said realizing a plurality of rows of strings of memory cells comprises realizing strings of memory cells having a dimension in said second direction;

said forming, between pairs of said consecutive rows of memory cell strings which are consecutive along said second direction, a slit comprises cutting and removing portions of the rows of strings of memory cells, said cut and removed portions extending in said third direction from said first end up to said source region and having extension along said second direction lower than, equal to or greater than half of said dimension of the memory cell strings in said second direction.

Preferably, said cut and removed portions extend along said second direction of a length substantially equal to said pitch of consecutive rows of memory cell strings which are consecutive along said second direction.

Preferably, said realizing rows of strings of memory cells comprises realizing substantially cylindrical strings of memory cells with an axis along said third direction, and said forming a slit between pairs of said consecutive rows of strings of memory cells which are consecutive along said second direction creates strings of memory cells with a shape of a portion of a cylinder, preferably a semi-cylindrical shape.

Thanks to the solution proposed in this document it is possible to realize 3D semiconductor memories with improved data storage capacity with respect to what is known in the art.

BRIEF PRESENTATION OF THE ATTACHED DRAWINGS

These and other features and advantages of the solution proposed in this document will appear more clearly from the reading of the following detailed description of some exemplary embodiments thereof, to be intended as non-limiting. For better intelligibility, in the following description reference will be made to the accompanying drawings, briefly presented below:

FIGS. 4A and 4B depict the structure of two different types of memory cell, respectively "Charge Trap" in FIG. 4A and "Floating Gate" in FIG. 4B, usable in the array of memory cells of the previous figures and in that according to the solution proposed in this document;

Figure 2:
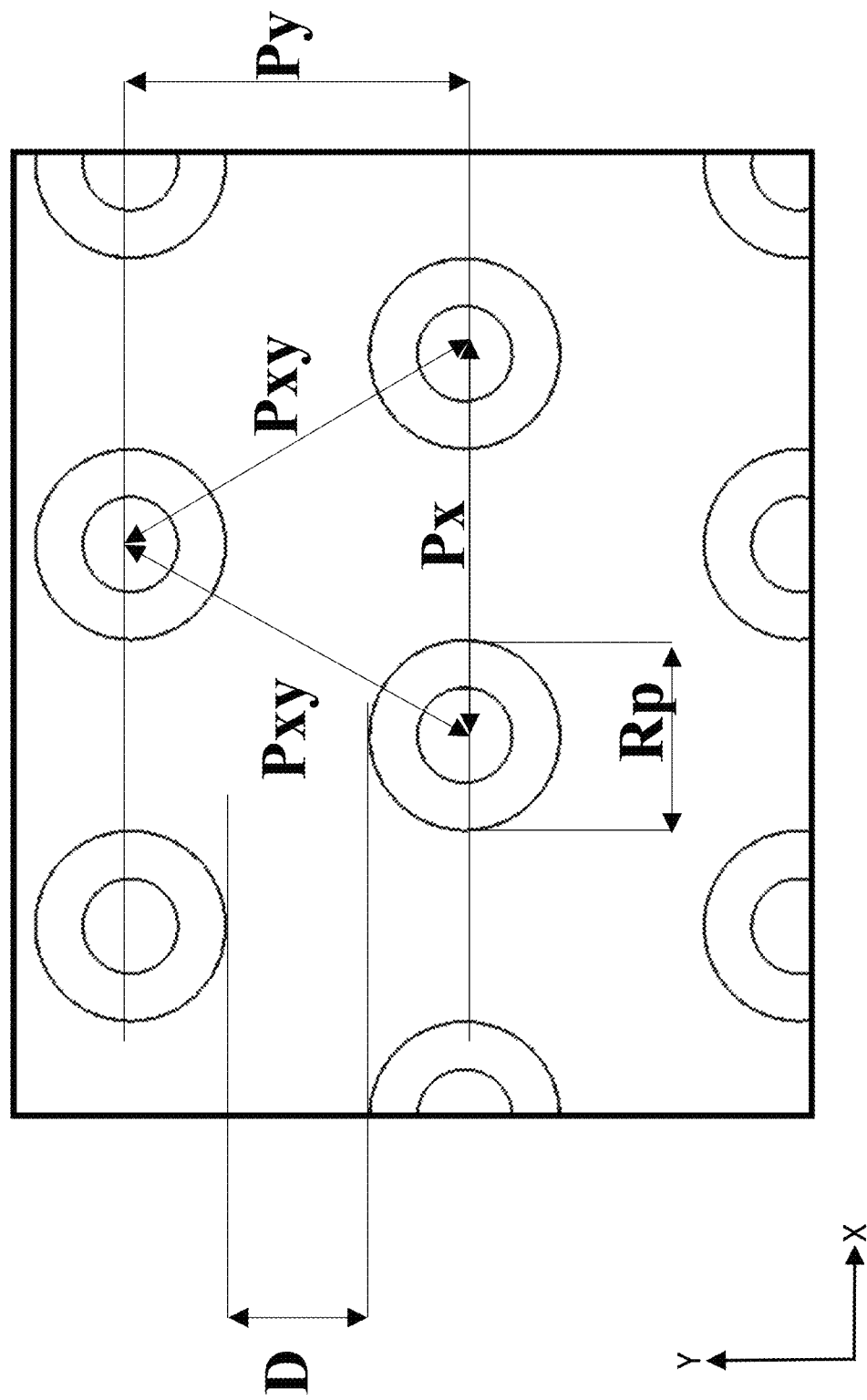
FIG. 2 is an enlargement of a part (indicated by A in FIG. 1B) of the memory cells matrix portion shown in FIG. 1A, with an indication of significant geometric distances.
Figure 6C:
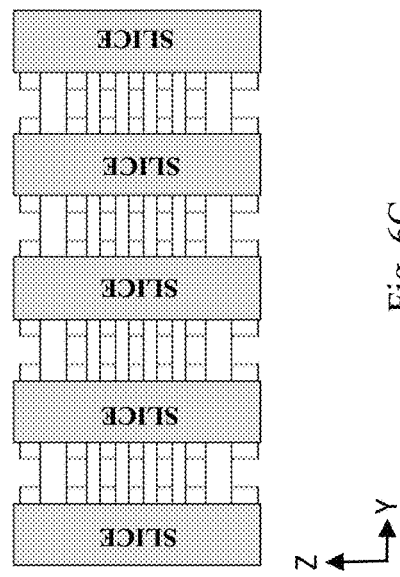
Figure 6B:
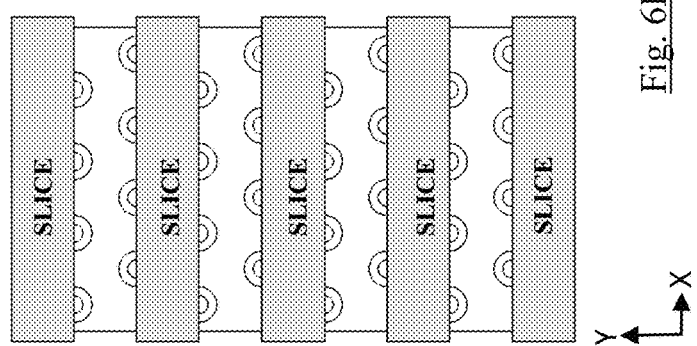
Figure 6A:
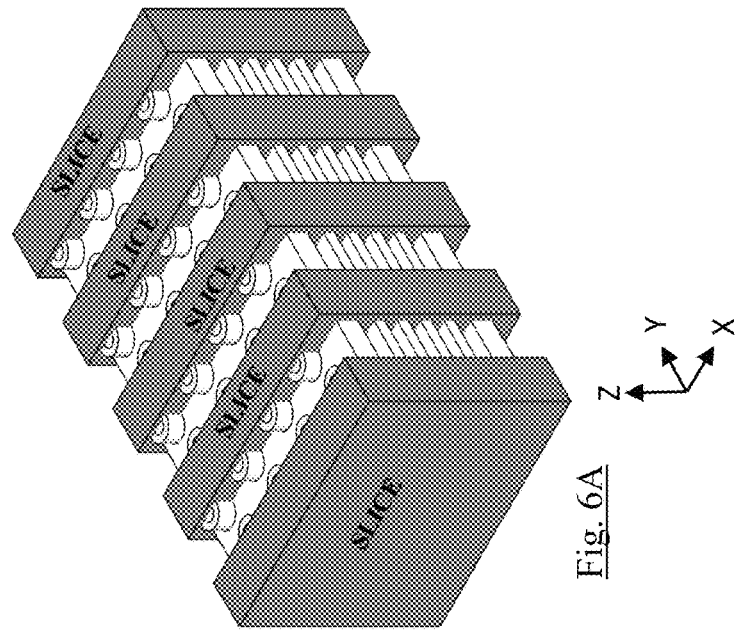
Figure 8:
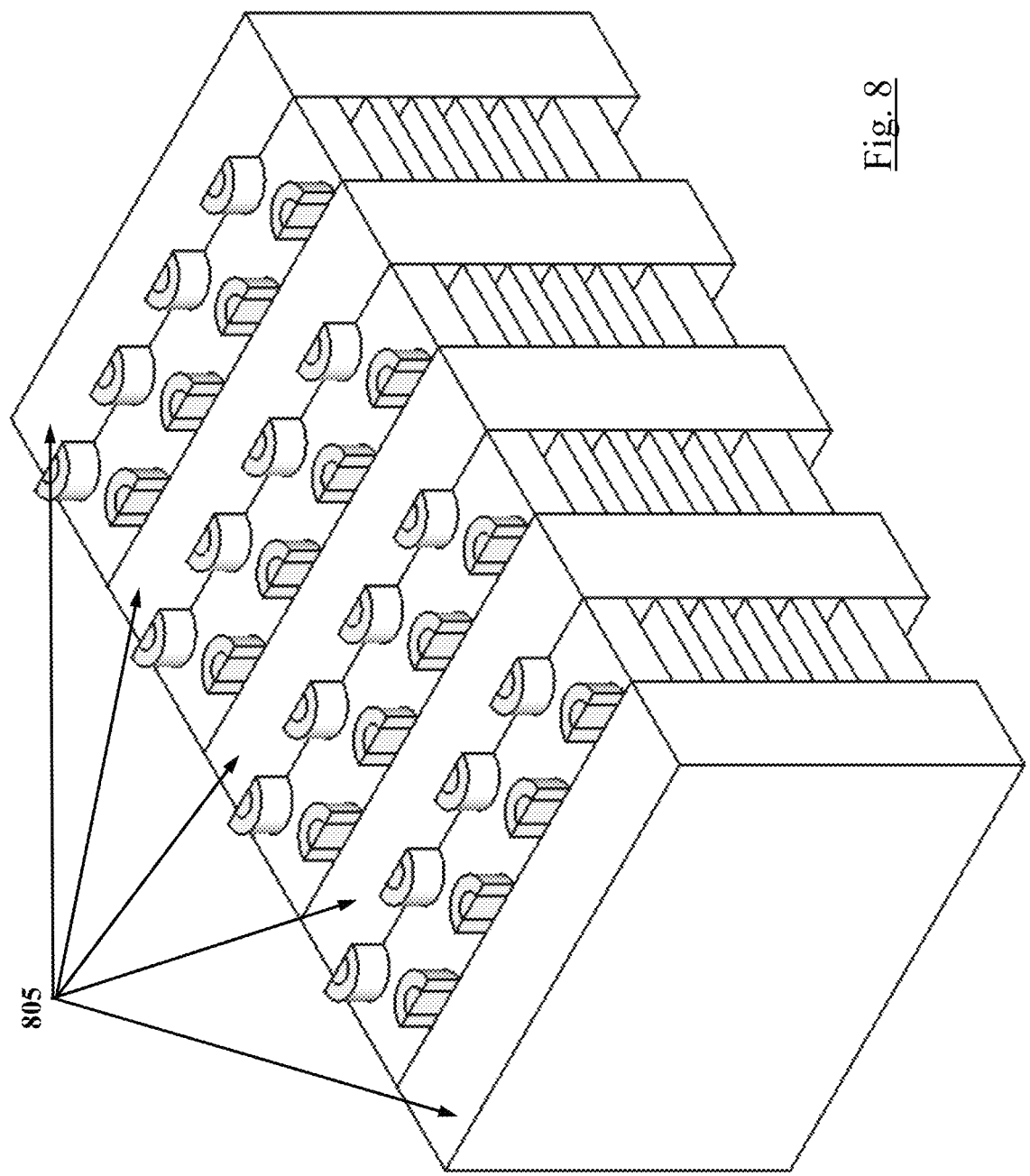
Figure 9:
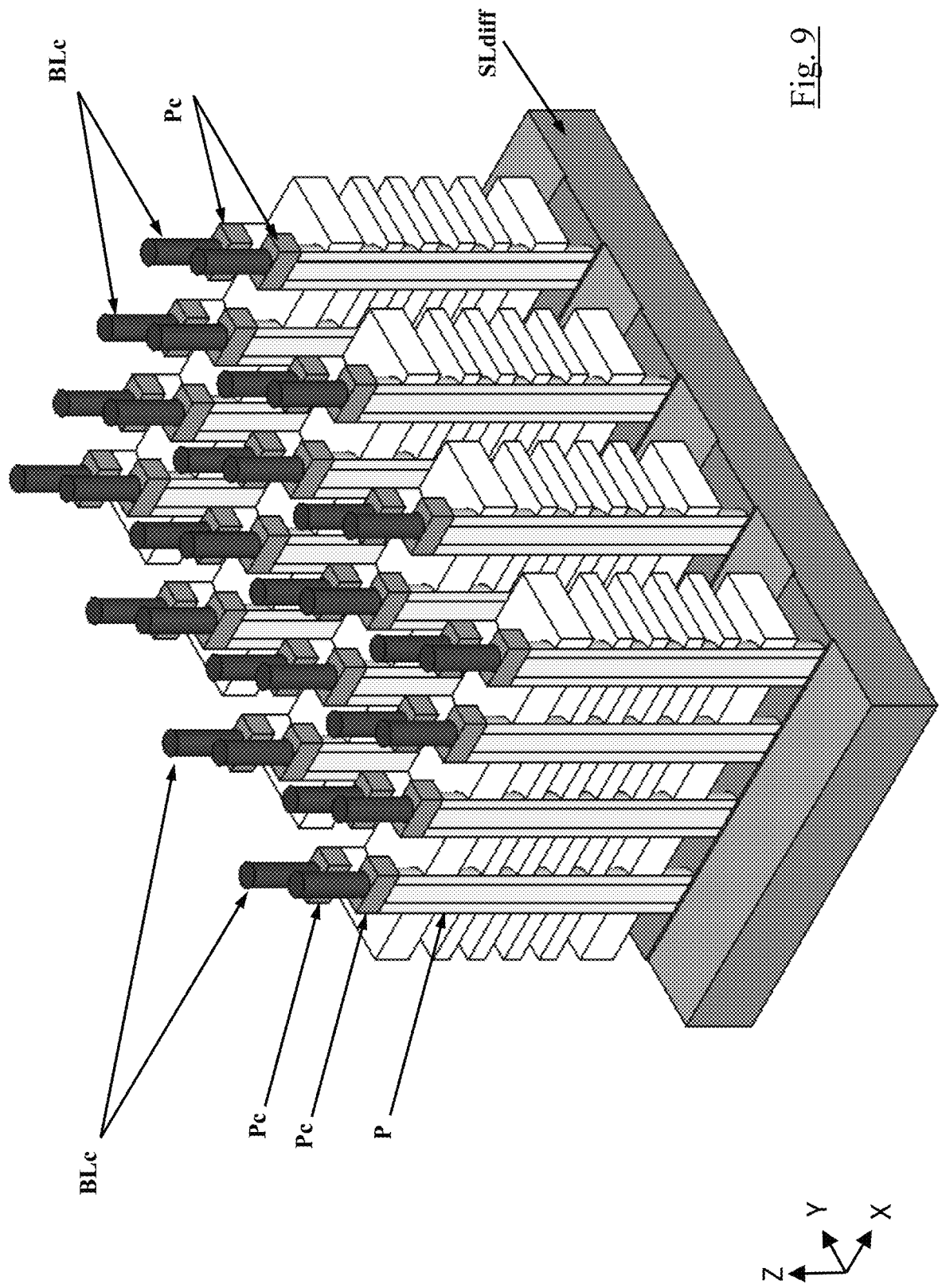
Figure 10A:
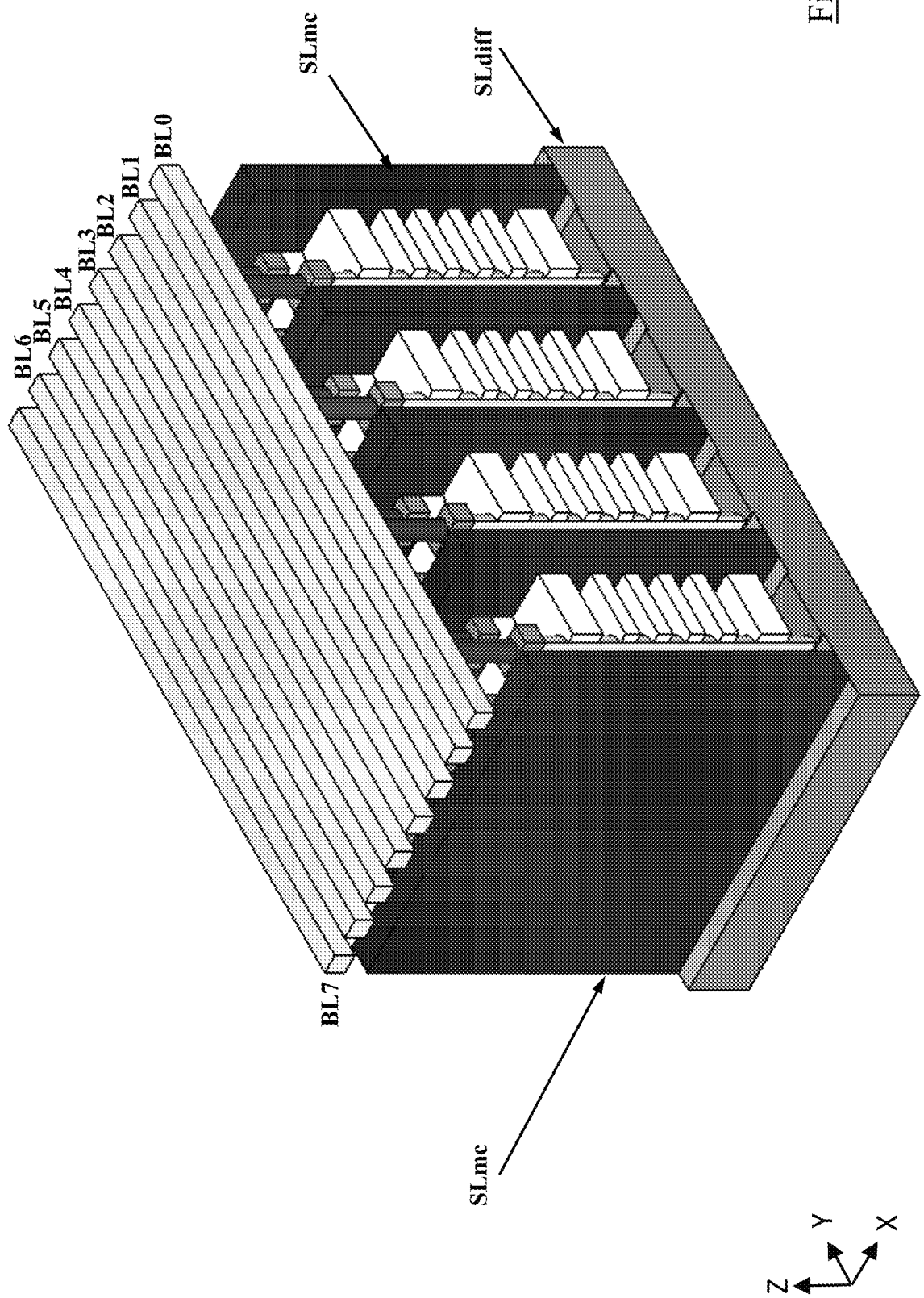
Figure 10E:
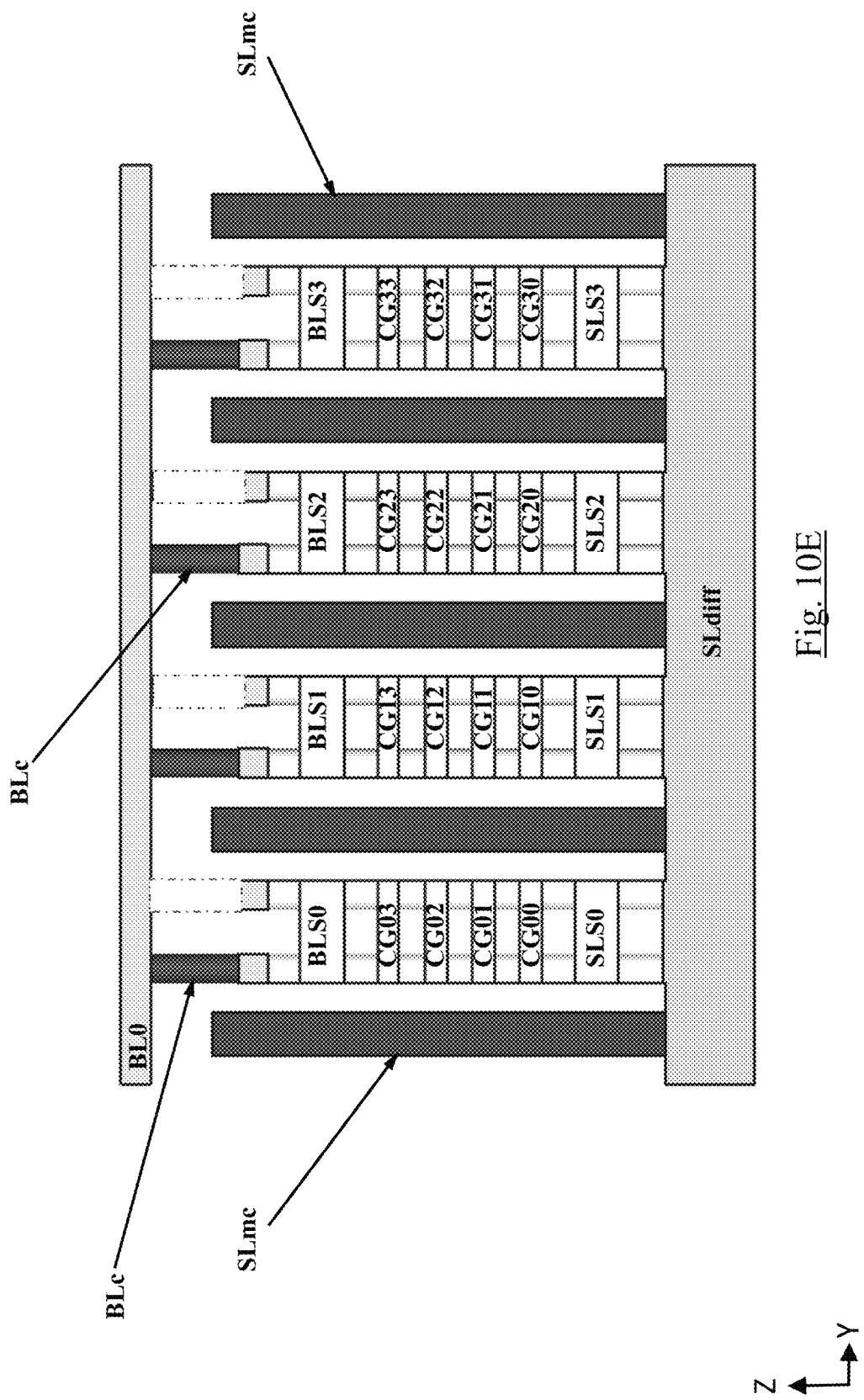
Figure 11:
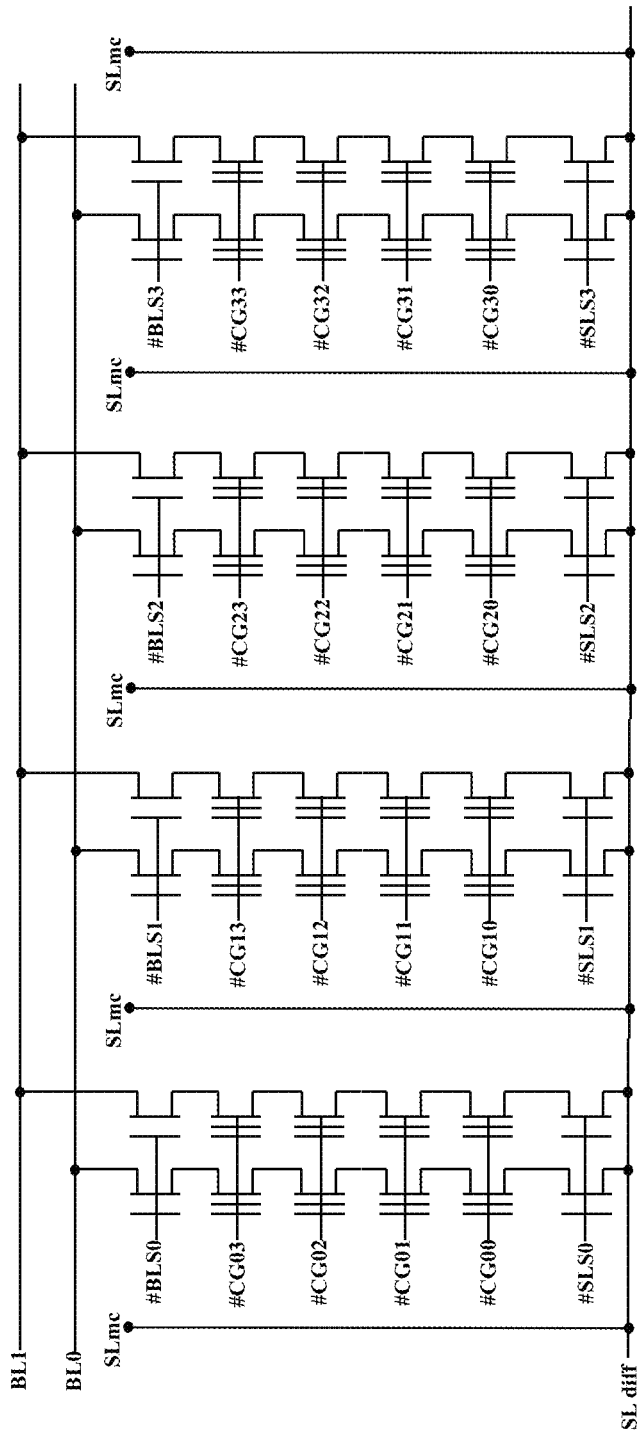
Figure 14:
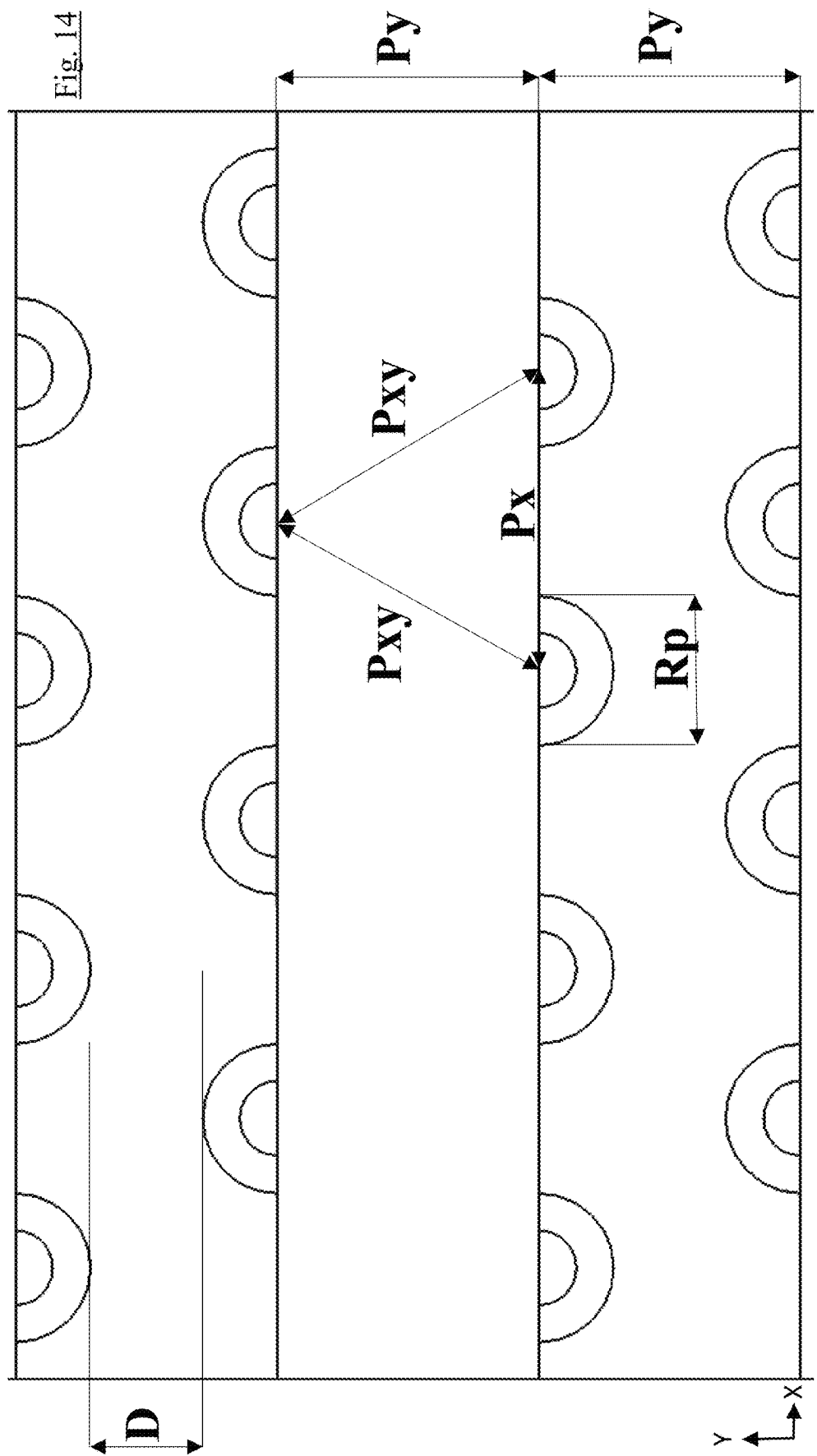
Figure 16C:
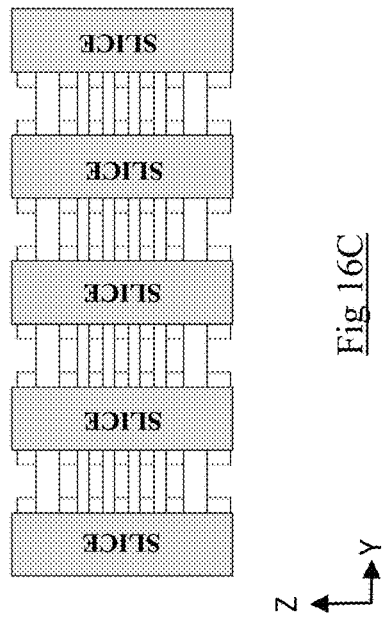
Figure 16B:
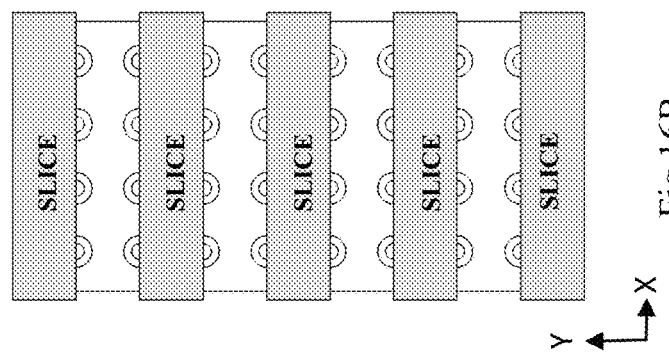
Figure 16A:
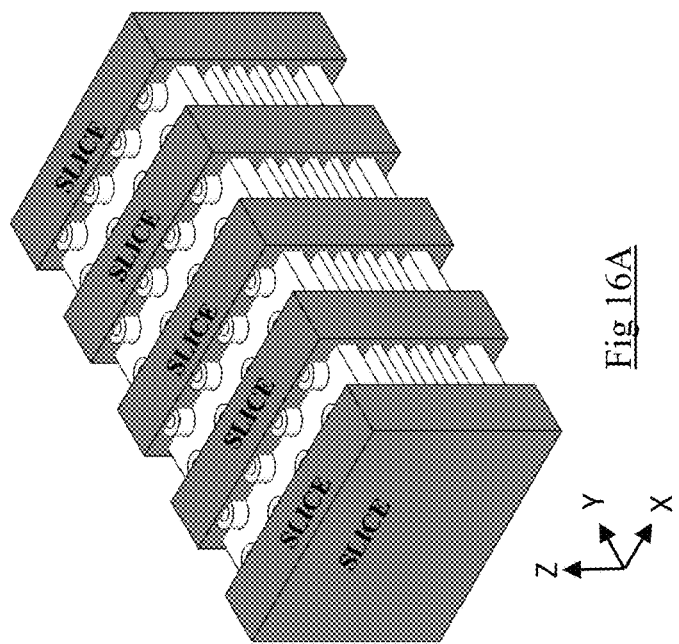
Figure 18:
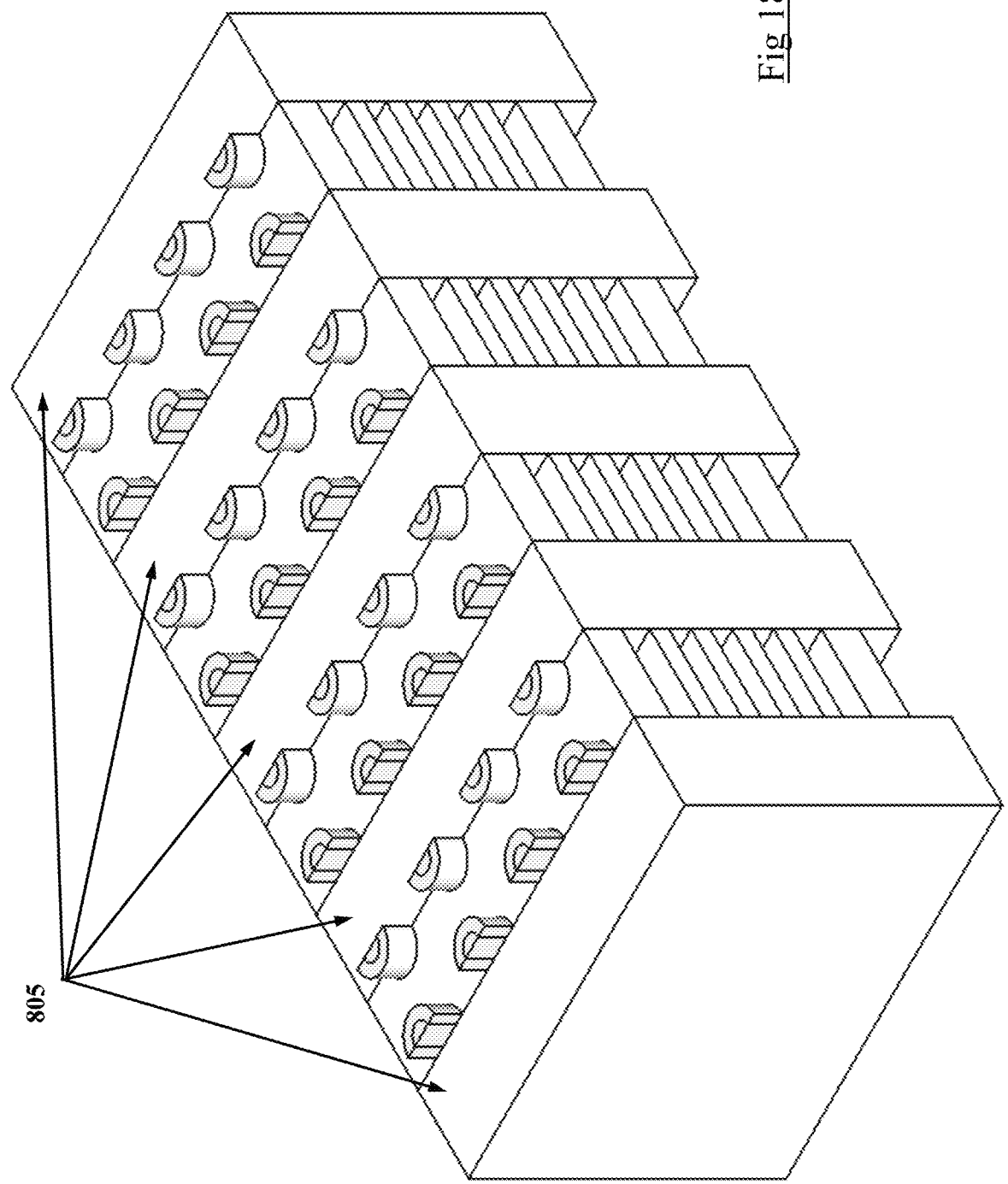
Figure 19A:
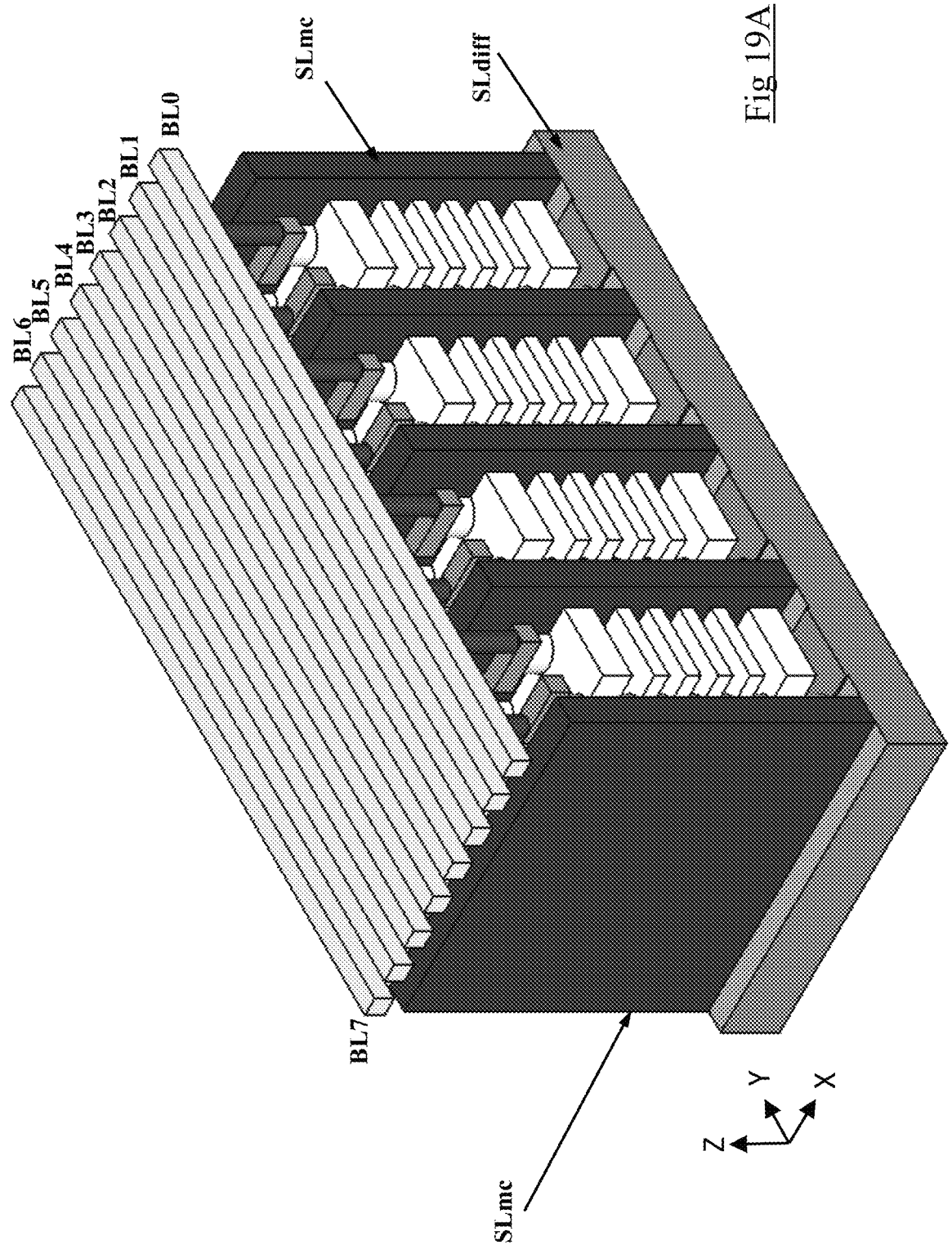
Figure 20:
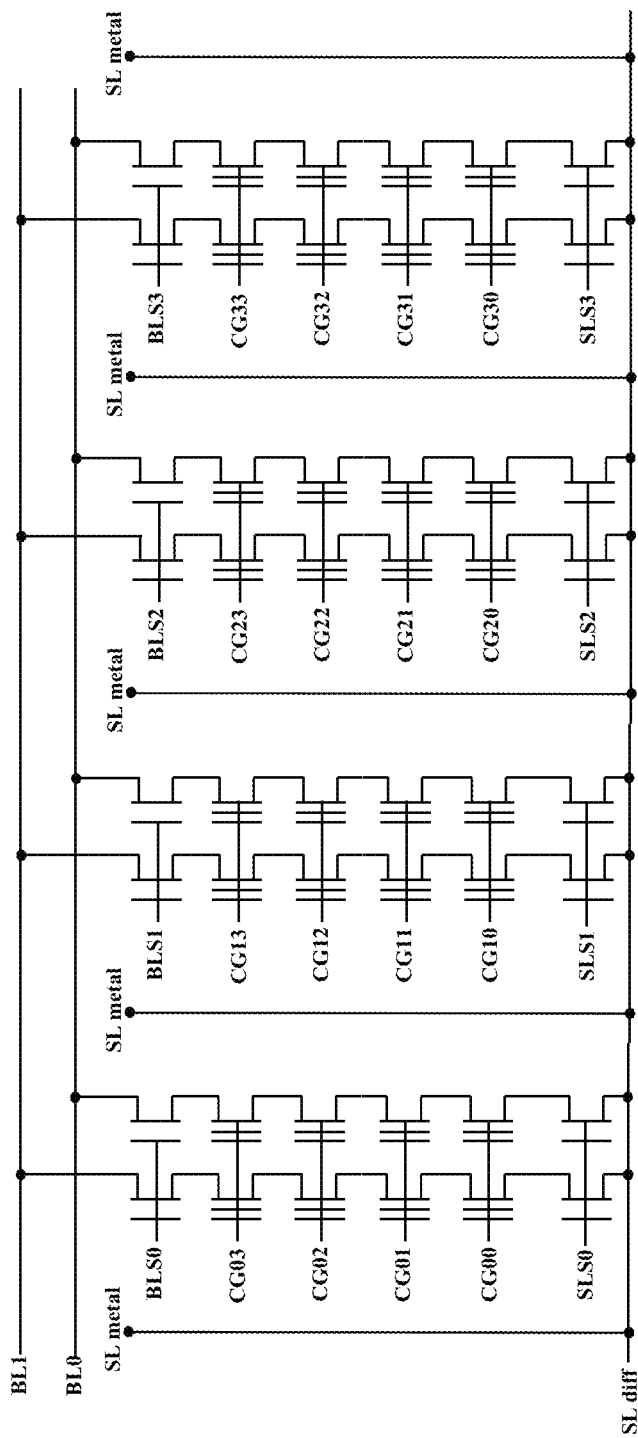
Figure 22:
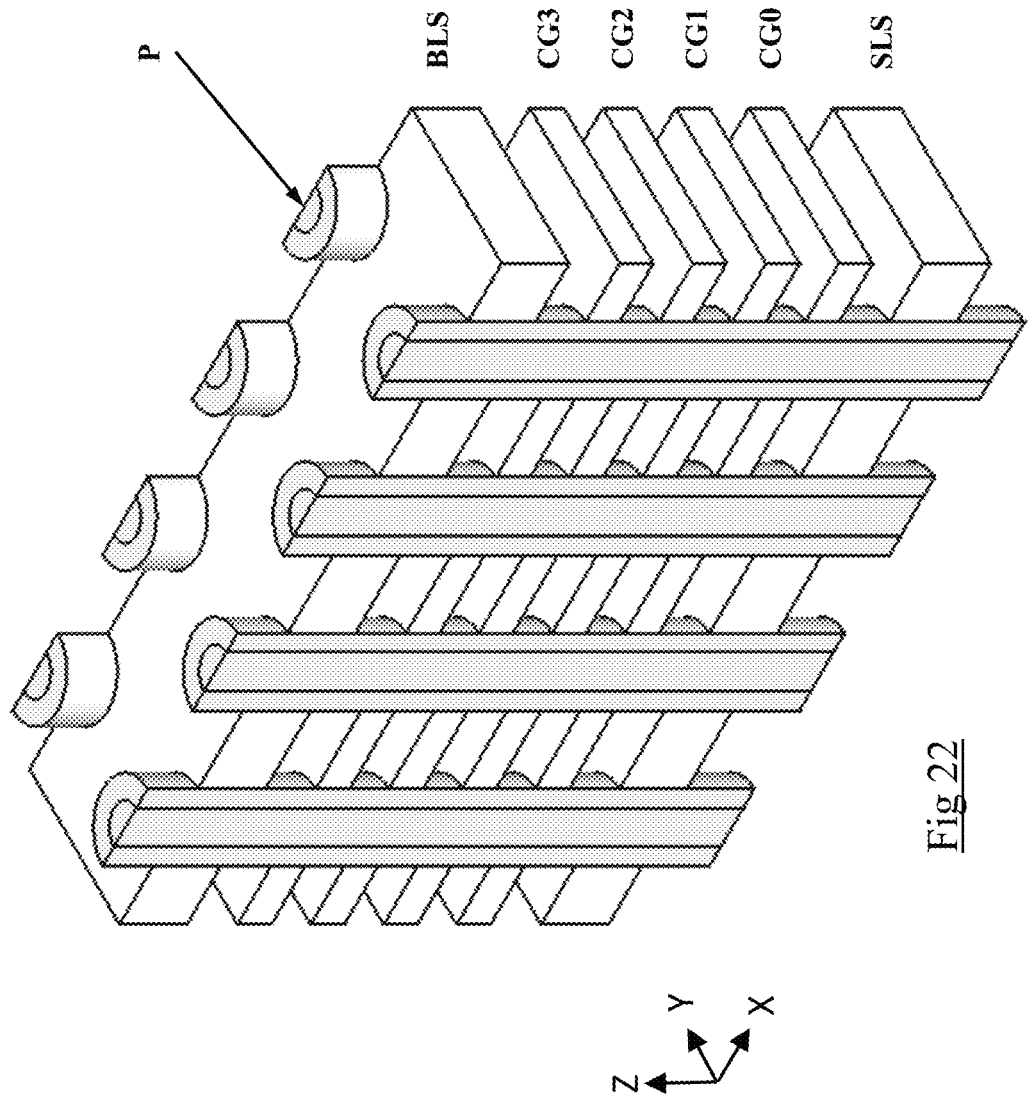
Figure 23:
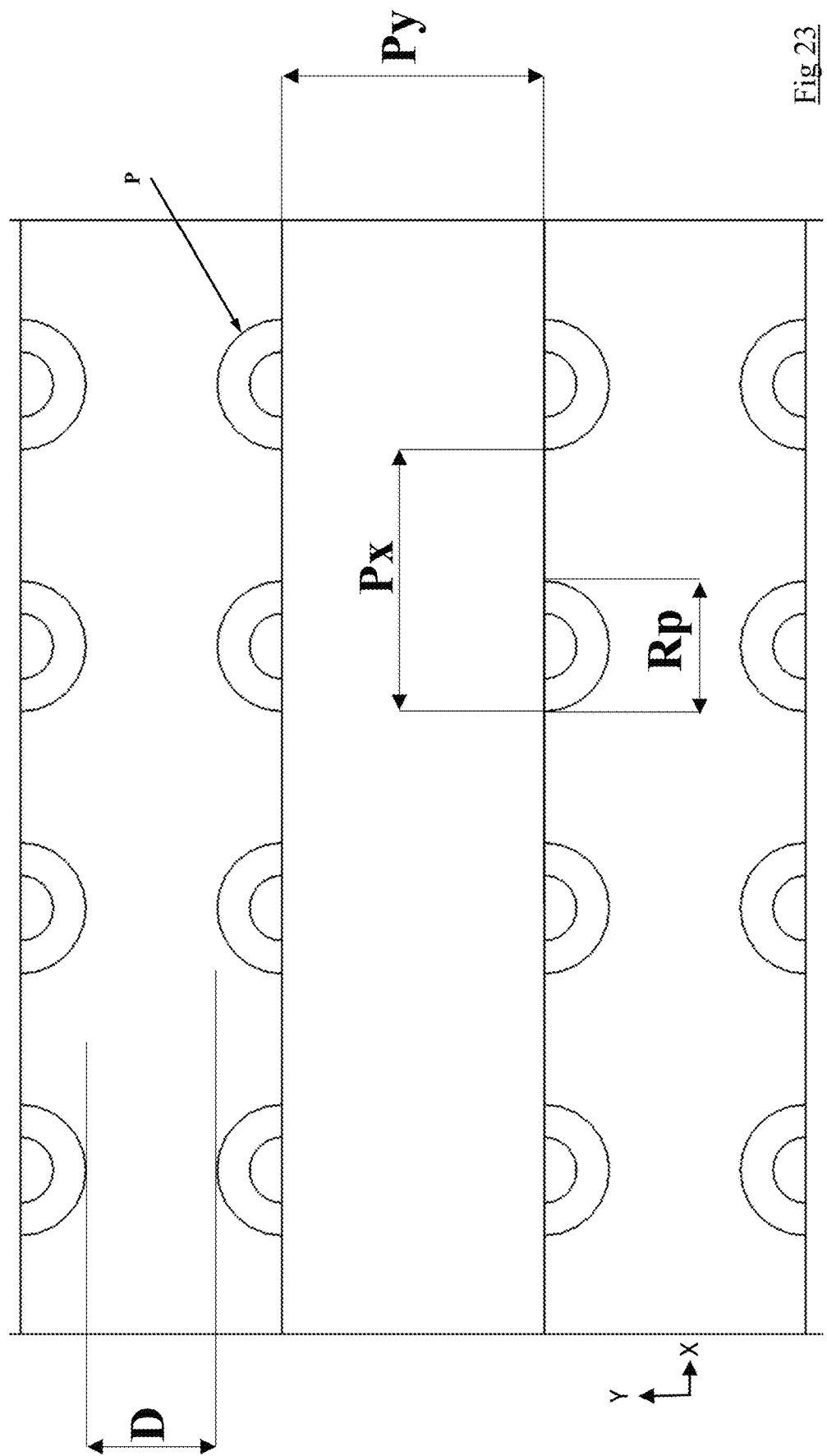

FIGS. 5-14 relate to a first embodiment of the solution proposed in this document, and in particular:

FIGS. 5A, 5B and 5C schematize a portion of a memory cells matrix of a 3D semiconductor memory in accordance with the first embodiment of the solution proposed in this document, respectively in axonometric view, in top view and in side view, in a construction phase;

FIGS. 6A, 6B and 6C are views similar to those of FIGS. 5A, 5B and 5C in a subsequent construction phase;

FIGS. 7A, 7B and 7C are views similar to those of FIGS. 6A, 6B and 6C in a still later construction phase;

FIG. 8 is a view similar to that of FIG. 7A, in a subsequent construction phase;

FIG. 9 is a view similar to that of FIG. 8, in a subsequent construction phase;

FIG. 10A is a view similar to that of FIG. 9, in a subsequent construction phase;

FIG. 10B is a top plan view of what is shown in FIG. 10A;

FIG. 10C is similar to FIG. 10B but with some elements shown in semi-transparency;

FIGS. 10D and 10E are two side views of FIG. 10A, from two different sides;

FIG. 11 shows the equivalent electrical circuit of the structure of FIG. 10A;

FIGS. 12A, 12B and 12C and FIG. 13 show, in axonometric views from various points of view, a basic block of the memory cell array according to the first embodiment shown in the preceding figures;

FIG. 14 shows, similarly to FIG. 2, significant geometric distances of the array of memory cells according to the first embodiment;

FIGS. 15-23 relate to a second embodiment of the solution proposed in this document, and in particular:

FIGS. 15A, 15B and 15C schematize a portion of a matrix of memory cells of a 3D semiconductor memory in accordance with the second embodiment of the solution proposed in this document, respectively in axonometric view, top plan view and side view, in a construction phase;

FIGS. 16A, 16B and 16C are views similar to those of FIGS. 15A, 15B and 15C in a subsequent construction phase;

FIGS. 17A, 17B and 17C are views similar to those of FIGS. 16A, 16B and 16C in a still later construction phase;

FIG. 18 is a view similar to that of FIG. 17A, in a subsequent construction phase;

FIG. 19A is a view similar to that of FIG. 18, in a subsequent construction phase;

FIG. 19B is a plan view of what is shown in FIG. 19A;

FIG. 19C is similar to FIG. 19B but with some elements shown in semi-transparency;

FIGS. 19D and 19E are two side views of FIG. 19A, from two different sides;

FIG. 20 shows the equivalent electrical circuit of the structure of FIG. 19A;

FIGS. 21A, 21B and 21C and FIG. 22 show, in axonometric views from various points of view, a basic block of the matrix of memory cells in accordance with the second embodiment of the preceding figures, and FIG. 23 shows, similarly to FIG. 2, significant geometric distances of the array of memory cells in accordance with the second embodiment.

DETAILED DESCRIPTION OF EXEMPLARY EMBODIMENTS OF THE SOLUTION PROPOSED IN THIS DOCUMENT

Figure 1A:
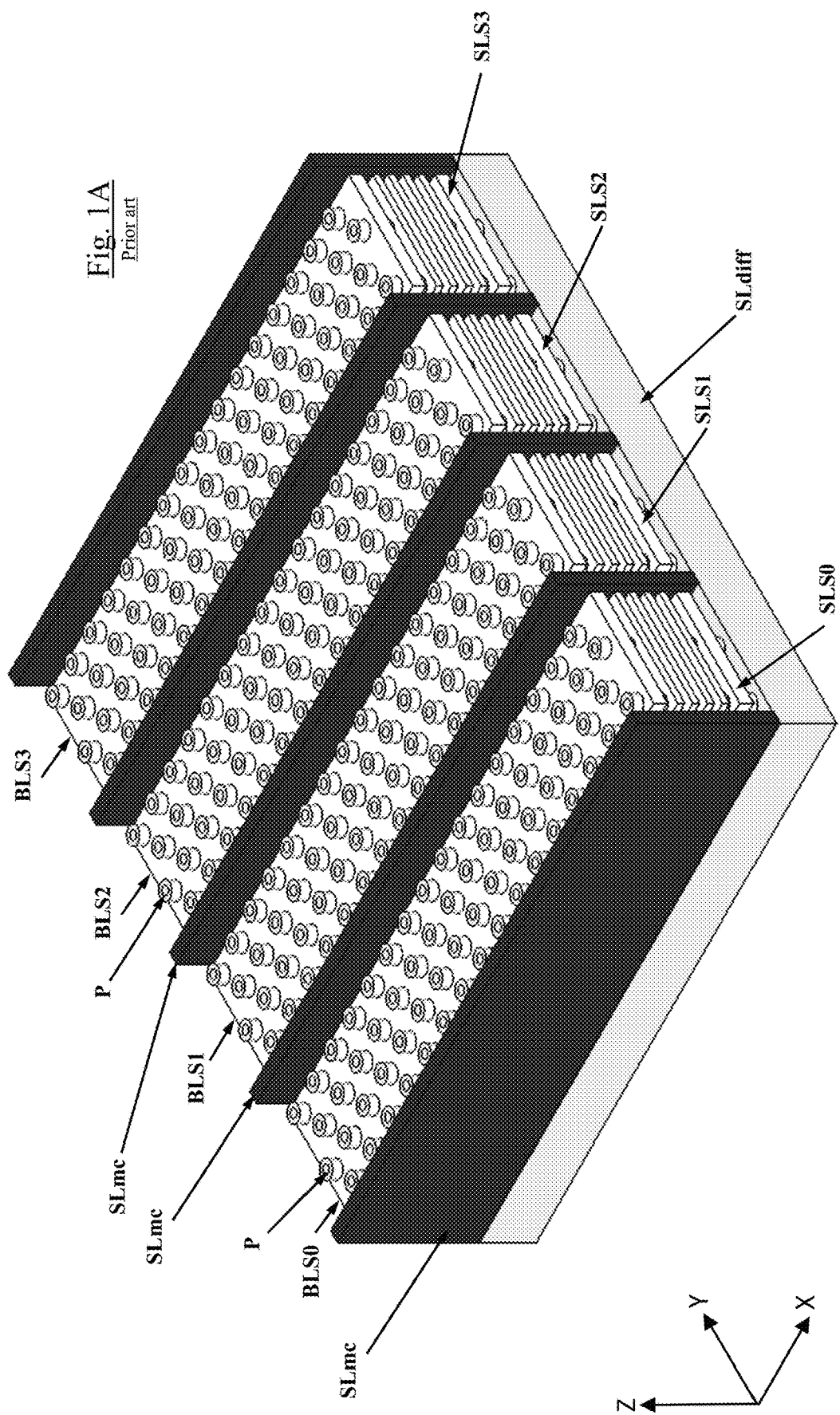
FIGS. 1A, 1B and 1C show a portion of an array of memory cells of a 3D semiconductor memory, with a known architecture, respectively in axonometric view, in top view and in side view.
Figure 1B:
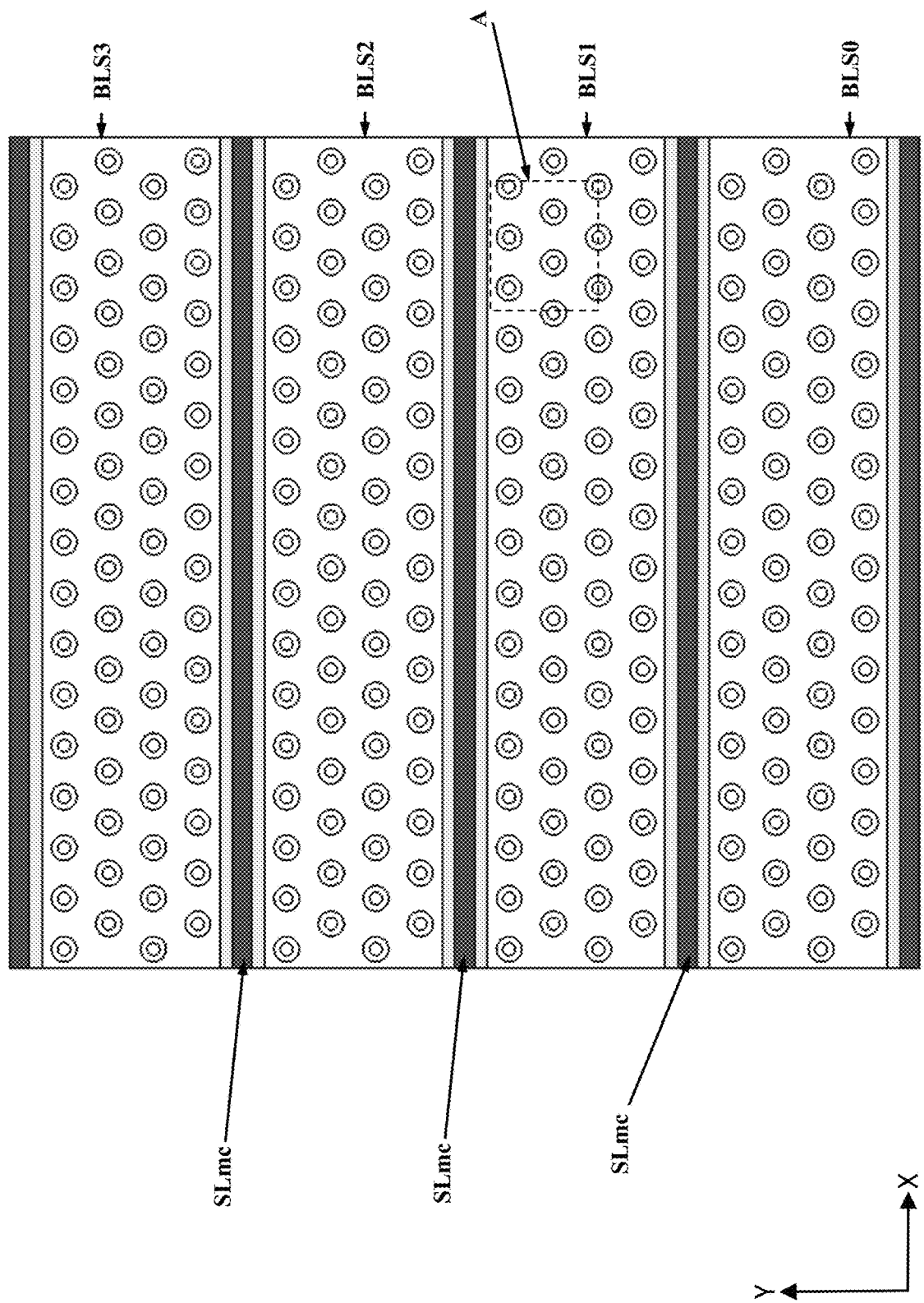
Figure 1C:
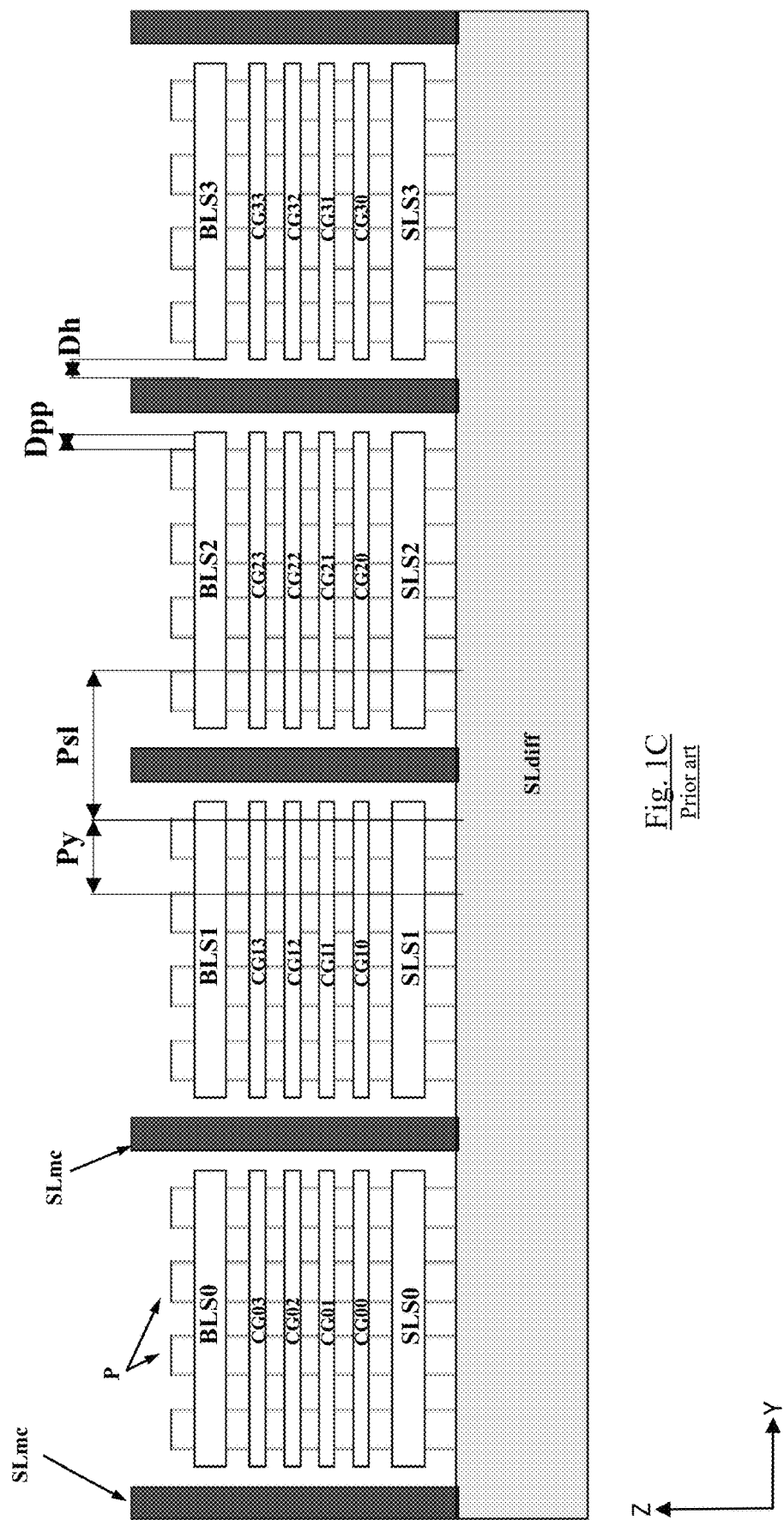

With reference to the drawings, FIGS. 1A, 1B and 1C show a portion of a memory cell array of a 3D semiconductor memory, with known architecture, respectively in axonometry, in top plan view and in side view.

The shown portion of memory cells matrix comprises four packets of pillars or strings P of memory cells. In particular, in the example considered, each packet of strings P of memory cells comprises 16×4=64 strings P of memory cells, arranged in 4 rows of 16 strings P of memory cells each. Each row of 16 strings P of memory cells comprises 16 strings P of memory cells aligned along the direction X indicated in the drawings. The 4 rows of 16 strings P of memory cells of each of the four packets of strings P are arranged in succession along the direction Y indicated in the drawings. In the shown example, the strings P of memory cells of a generic row of 16 strings P are not aligned, in the direction Y, to the strings P of the adjacent row of 16 strings P (irrespective of such adjacent row being belonging to the same packet of strings P or to an adjacent packet of strings P), being the position along the direction X of the strings P offset with respect to the position of the strings P of the adjacent row of 16 strings P (irrespective of such adjacent row being belonging to the same packet of strings P or to an adjacent packet of strings P); the strings P of memory cells of a generic row of 16 strings P are instead aligned, in the direction Y, to the strings P of the row of 16 strings P next to the adjacent row (irrespective of such adjacent row being belonging to the same packet of strings P or to an adjacent packet of strings P). The offset in the direction X is, in the shown example, equal to half the pitch between the strings P of a generic row of strings P. In this way a substantially "zig-zag" arrangement ("staggered" arrangement) of the strings P of memory cells is obtained. Nothing prevents, however, from arranging the strings P of memory cells of the different rows so as to be aligned also in the direction Y (as in the second embodiment of the solution proposed in the present document, described below), although the offset, i.e. zig-zag arrangement allows to obtain a greater compactness of the memory cell array.

The strings P of memory cells comprise various layers of material which define the structure of the memory cells. In particular, the memory cells may for example be of the "Charge Trap" type (CT), as shown in FIG. 4A, or of the floating gate type ("Floating Gate" or FG), as shown in FIG. 4B. Without entering into too much detail, since both types of memory cells are known to those skilled in the art, in the case of CT cells the strings P comprise, moving radially from their periphery towards their center, an outer blocking layer ("Blocking Layer"), an electric charges entrapment layer ("Charge Trap"), a tunnel oxide layer ("Tunnel Ox"), a channel layer ("Channel") and a central filling layer ("Filler"). In the case of FG cells, the strings P comprise, always radially from their periphery towards their center, a layer of dielectric material ("Interpoly Dielectric"), a layer forming the floating gate ("FG"), a tunnel oxide layer ("Tunnel Ox"), a channel layer ("Channel") and a central filling layer ("Filler").

The type, that is, the specific structure of the memory cells is not however essential for the solution presented in this document, which is for example applicable both to CT memory cells and to FG memory cells as well as to memory cells having a different structure.

Returning to FIGS. 1A, 1B and 1C, each reference numeral BLS0, BLS1, BLS2 and BLS3 indicates a respective group of bit line selectors. The bit line selectors include for example switches, for example transistors (e.g., MOS transistors) suitably controlled for selectively electrically connecting/disconnecting the strings P of memory cells to/from bit lines ("bit lines") of the memory (not shown in FIGS. 1A, 1B and 1C, indicated in the equivalent electrical circuit of FIG. 3). The structure of the bit line selectors is not shown in detail, being instead schematized by rectangular blocks.

Reference numerals CG00-CG03, CG10-CG13, CG20-CG23 and CG30-CG33, shown in FIG. 1C, indicate control gates, in the example considered here in number of 16, for 256×4=1,024 memory cells belonging to the memory matrix portion shown in FIGS. 1A-1C. In particular, each packet of strings P of memory cells comprises 256 memory cells, arranged in groups of 4 memory cells along each string P of memory cells. Each packet of strings P of memory cells has associated 4 control gates, stacked along the direction Z indicated in the drawings: proceeding from right to left along the direction Y shown in FIG. 1A, the first packet of strings P has associated the 4 control gates CG00-CG03, the second packet of strings P has associated the 4 control gates CG10-CG13, the third packet of strings P has associated the 4 control gates CG20-CG23 and the fourth packet of strings P has associated the 4 control gates CG30-CG33.

Due to the fact that each string P of memory cells comprises 4 memory cells in succession (stacked), the memory is said to be a "4 Layers" memory). The state of the art knows 3D memory devices with a different number of layers, for example with 24, 36 and even 48 layers, wherein each string P of memory cells contains, respectively, 24, 36 and 48 memory cells (and a corresponding number of control gates). The solution presented here is applicable regardless of the number of layers (i.e., irrespective of the number of memory cells in the strings P).

All the strings P of memory cells terminate (on the bottom, according to the orientation of the drawings, on the opposite side with respect to the bit line selectors BLS0, BLS1, BLS2 and BLS3) in a common source conductive region SLdiff, obtained for example by diffusion of dopant species (p-type or n-type) in a semiconductor material substrate (not shown). For example, the common source conductive region SLdiff may be a region of doped p+ or n+ semiconductor material. Other materials can however be used to realize the common source conductive region SLdiff.

Each packet of strings P has associated therewith a respective group of source line selectors SLS0, SLS1, SLS2 and SLS3. The source line selectors comprise, for example, transistors (e.g., MOS transistors) for selectively electrically connecting/disconnecting strings P of memory cells to the common source conductive region SLdiff. The structure of the source line selectors is not shown in detail, being instead schematized by rectangular blocks.

The four packets of strings P of memory cells and the associated groups of bit line selectors BLS0, BLS1, BLS2 and BLS3, the control gate groups CG00-CG03, CG10-CG13, CG20-CG23 and CG30-CG33, the groups of source line selectors SLS0, SLS1, SLS2 and SLS3 are separated by cuts, slits in the layers of material that constitute the bit line selectors BLS0, BLS1, BLS2 and BLS3, the control gate CG00-CG03, CG10-CG13, CG20-CG23 and CG30-CG33, the source line selectors SLS0, SLS1, SLS2 and SLS3 (and the intermediate layers). The slits extend along the direction Z down to the common source conductive region of SLdiff. In each of these slits there is formed a respective wall SLmc made of electrically conductive material, such as metal (for example tungsten), laterally insulated from adjacent layers of material, to bring to the surface of the structure (to the top, according to the orientation of the drawings) an electrical contact to the common source conductive region SLdiff.

Figure 3:
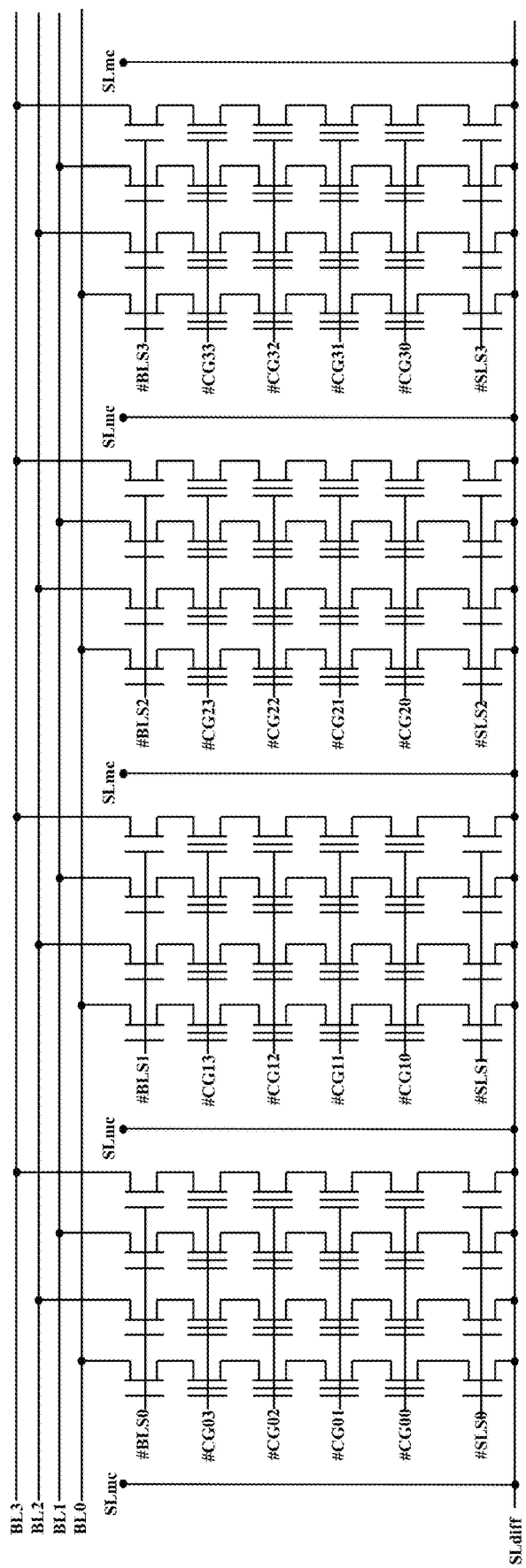
FIG. 3 shows the equivalent electrical circuit of the structure of FIG. 1C.

FIG. 3 is an equivalent electric circuit diagram of the structure visible in FIGS. 1A, 1B and 1C. The bit line selectors of each of the 4 groups of bit line selectors BLS0, BLS1, BLS2 and BLS3 are controlled by a respective common bit line selection command signal #BLS0, #BLS1, #BLS2 and #BLS3. By activating the bit line selectors, the strings P of memory cells can be electrically connected to respective bit lines BL0-BL3. The source line selectors of each group of source line selectors SLS0, SLS1, SLS2 and SLS3 are controlled by a respective common source line selection control signal SLS0#, #SLS1, #SLS2 and #SLS3. The gate gates CG00-CG03, CG10-CG13, CG20-CG23 and CG30-CG33 of the memory cells of each packet of strings P of memory cells are controlled by respective control gate selection signals #CG00-#CG03, #CG10-#CG13, #CG20-#CG23 and #CG30-#CG33. The bit line selection control signals #BLS0, #BLS1, #BLS2 and #BLS3, the control signals for the selection of common source line #SLS0, #SLS1, #SLS2 and #SLS3 and the control signals for the selection of the control gate # CG00-# CG03, # CG10-# CG13, # CG20-# CG23 and # CG30-# CG33 are generated by decoding circuits of memory cell addressing signals (not shown). The control gates CG00-CG03, CG10-CG13, CG20-CG23 and CG30-CG33 constitute the word lines of the memory.

In the enlargement shown in FIG. 2 significant geometrical dimensions of the structure shown in FIGS. 1A-1C are indicated. In particular, reference numeral Rp indicates the width (in the direction X) of the generic string P of memory cells. The strings P of memory cells can for example have a cylindrical shape, so that their width Rp in the direction X substantially coincides with the width in the direction Y and corresponds to the diameter of the cylinders that form the strings P. The reference numeral D indicates the distance between the edges of the P strings of two rows of adjacent strings P. numeral Px indicates the pitch of the strings P of memory cells along the direction X, i.e. the distance between the centers (axes) of two adjacent strings P of the same row of strings P. Reference numeral Py indicates the pitch, along the direction Y, of the rows of 16 strings P of memory cells, i.e. the distance between two rows of adjacent strings P (measured between the centers of the respective strings P). Reference numeral Pxy indicates the distance between the center of a string P of a row of strings P and the center of the adjacent string P in the row of strings P adjacent along the direction Y. Other significant distances are shown in FIG. 1C. In particular, reference numeral Psi indicates the pitch, in the Y direction, between two strings P in correspondence of a slit in which a wall SLmc is formed: it is possible to notice that the pitch Psi is greater than the pitch Py, this being due to the technological need of respecting distances Dpp between the edge of the string P near the slit and the edges of the slit itself and distances Dh between the edges of the slit and the surfaces of the wall SLmc.

In other words, the need to provide the slots for forming the SLmc contact walls to the source region SLdiff alters the regularity of the memory cell array and causes an area increase with respect to a regular arrangement of slit-free memory cells. This has a negative impact on the density of memory cells per unit area, and consequently on the storage capacity of data per unit area.

In the following, two embodiments of the solution proposed in this document will be presented, which allow to obtain more compact structures of memory matrix of memory cells.

First Embodiment

A first embodiment of the solution proposed in this document is shown in FIGS. 5-14.

Starting from the structure shown in FIGS. 5A-5C, which represents a portion of a matrix of memory cells (the memory cells may for example be of the CT type, as shown in FIG. 4A, or of the FG type, as shown in FIG. 4B) with regular arrangement, with distances between the strings P as indicated in FIG. 2 and without the slits for realizing the SLmc contact walls to the source region SLdiff (not shown in the figures), the structure is "sliced" by realizing (by means of known lithographic techniques) regular cuts and excavations and removing slices SLICE of the structure (comprising the layers of bit line selectors, control gates, source line selectors, and intermediate layers thereto), as shown in FIGS. 6A-6C.

In particular, the slices SLICE which are removed have a substantially rectangular parallelepiped shape, with bases lying on planes XZ and heights along the direction Y. The slices SLICE have a width that also affects the P strings: the generic slice SLICE cuts all the strings P of two respective rows of consecutive strings P in the direction Y. The strings P are preferably, but not limitatively, cut in half, that is (in the example of cylindrical P strings) at their diameter in the direction X. Moreover, in alternative embodiments, it is possible to size the width of the slices SLICE so that the strings P of the two rows adjacent to the slice SLICE are cut for less or more than half of them.

The removal of the slices SLICE defines the groups of bit line selectors BLS0, BLS1, BLS2 and BLS3, the control gates CG00-CG03, CG10-CG13, CG20-CG23 and CG30-CG33, the groups of source line selectors SLS0, SLS1, SLS2 and SLS3, as shown in FIGS. 7A-7C.

The spaces left empty by the removal of the slices SLICE are advantageously exploited to make the contacts to the source region SLdiff, as will be described hereinafter.

Preferably, the spaces left empty by the removal of the slices SLICE are filled with insulating material 805, for example a dielectric material and/or an oxide, as shown in FIG. 8. The insulating material 805 is then selectively removed centrally from the spaces left empty by the removal of the slices SLICE, remaining along the walls of the spaces themselves, so as to isolate the bit line selectors, the control gates and the source line selectors.

In the following figures, the insulating material 805 remaining within the spaces left empty by the removal of the slices SLICE is no longer shown, in order not to render the figures less intelligible.

As shown in FIG. 9, electrically conductive material contacts (e.g. metallic material, such as aluminum or tungsten, or polysilicon) are made to the strings P of memory cells for the subsequent bit line connection (bit line contacts). In particular, the bit line contacts can for example comprise a first contact portion Pc to the respective string P, having a dimension substantially corresponding to the size of the strings P, and a second contact portion BLc, for example smaller in size than the first contact portion Pc, for contact to the respective bit line, said second contact portion BLc being in physical and electrical contact with the first contact portion.

Subsequently, as shown in FIGS. 10A-10E, contact walls SLmc of electrically conductive material are formed to contact the source region SLdiff, and subsequently the bit lines of electrically conductive material are made. In the example shown in the drawings, 8 bit lines BL0-BL7 are in particular formed. The bit lines extend in direction Y and the generic bit line BL0-BL7 contacts, through bit line contacts BLc and Pc, strings P belonging to rows of alternated strings P (because, thanks to the "zig-zag" arrangement of the strings P, the generic bit line BL0-BL7 passes above only the strings P of half the rows of strings P).

FIG. 11 shows an equivalent electrical circuit of the structure of FIG. 10 relative to the portion of the structure associated with the first two bit lines BL0 and BL1.

FIGS. 12A-12C show a portion of the structure of FIG. 10 which can be considered as a monolithic elementary block, respectively with and without contacts to the bit lines and to the source region SLdiff. In other words, that shown in FIGS. 12A-12C is the basic structure that, suitably replicated (joined) with regularity both in the direction X and in the direction Y form the complete regular matrix.

Figure 13:
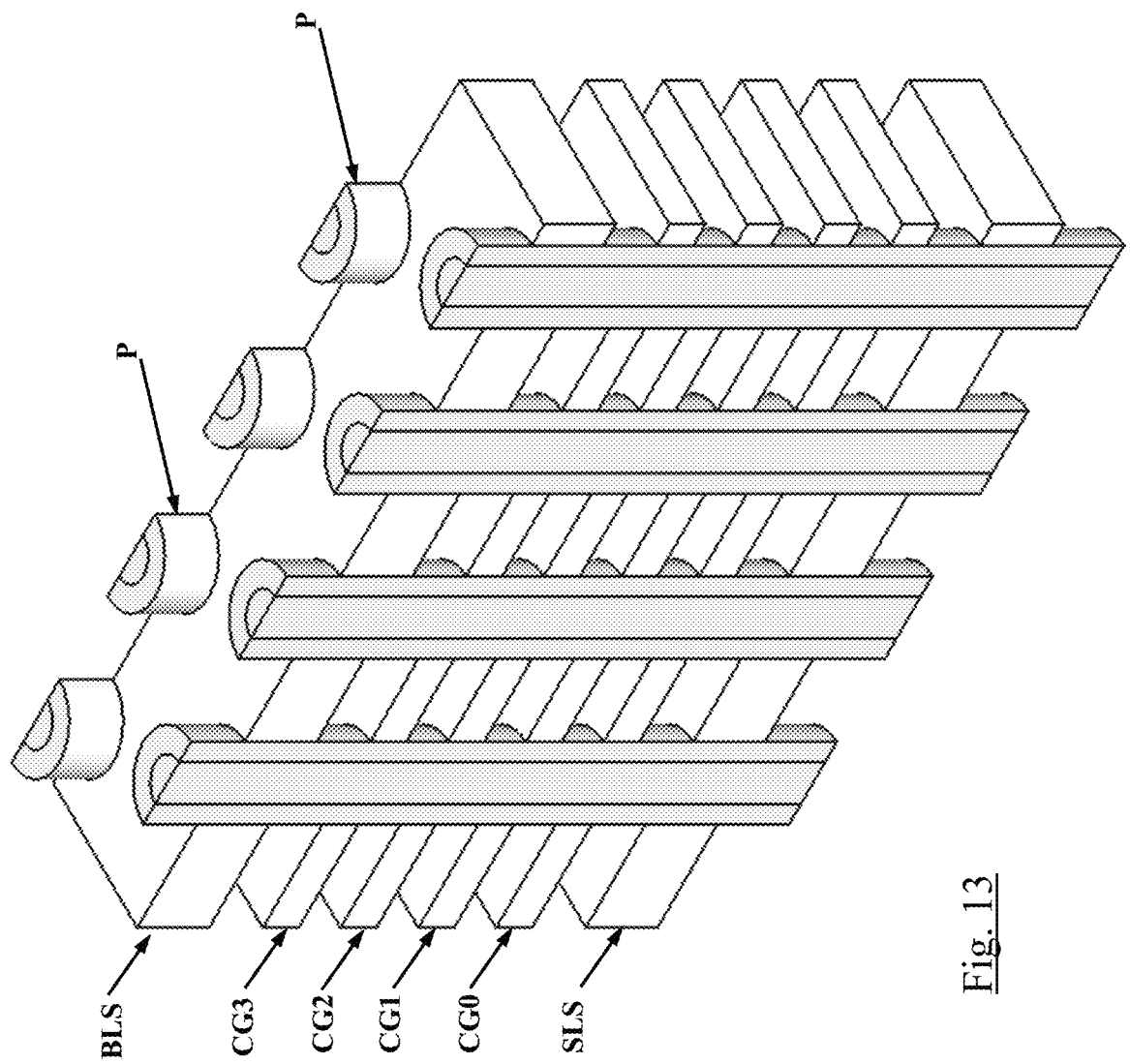

As shown in FIG. 13, tutt and strings P of sectioned memory cells advantageously maintain the same shape and size, so that the matrix of memory cells have almost the same functional characteristics (unless the inevitable statistical variations).

As shown in FIG. 14, the structure maintains the minimum technological distances D, Rp, Px, Py, Pxy, despite having created space to make the contacts (walls SLmc) to the source region SLdiff. In particular, with respect to what is shown in FIG. 1C, it is no longer necessary to maintain the distances Dpp and Dh, thanks to the fact that there is at least a distance in the direction Y equal to the size Rp exploitable to create spaces in which contact walls SLmc the source region SLdiff can be formed.

The gain that is obtained in terms of overall density of the memory cell matrix is remarkable.

Second Embodiment

A second embodiment of the solution proposed in this document is shown in FIGS. 15-23.

The second embodiment differs from the first embodiment in that the strings P of memory cells of a generic row along the direction X are not offset, in the direction X, with respect to the strings P of the adjacent row, but are aligned, in the direction Y, to the strings P of the row of 16 strings P next to the adjacent row. There are therefore alignments of strings P of memory cells both in the direction X and in the direction Y without a zig-zag arrangement.

As in the first embodiment, the generic bit line BL0-BL7 contacts, through bit line contacts BLc and Pc, strings P belonging to alternated rows of strings P. Since, however, in this second embodiment, missing the "zig-zag" arrangement of the strings P, the generic bit line BL0-BL7 passes above the strings P of all the rows of strings P, in order to make the contact of a generic bit line BL0-BL7 to strings P belonging to alternated rows of strings P the structure of the bit line contacts is slightly different: the first contact portions Pc have a greater dimension in the direction X, corresponding to the width along the direction X of two adjacent bit lines (inclusive their separation distance); the second contact portions BLc are formed in "zig-zag" arrangement, as shown in FIG. 19C and in FIG. 21C.

With the exception of this, all what has been described in relation to the first embodiment remains valid also for the second embodiment.

Even in this case, as in the previous embodiment, the structure maintains the minimum technological distances D, Rp, Px, Py, Pxy despite having created the spaces for the contact walls SLmc to the source region SLdiff, as shown in FIG. 23.

The described architectures according to the solution proposed in this document allow to obtain very compact structures, and consequently memories with high data storage capacity per unit area.

What is claimed is:

1. A method of making a three-dimensional, 3D, memory device comprising:
forming a plurality of rows of strings of memory cells, each row of strings of memory cells comprising an alignment of strings of memory cells extending along a first direction, said rows following one another along a second direction, wherein each string of memory cells comprises a stack of memory cells, said strings of memory cells of the stack extending along a third direction from a first end to a second end, wherein rows of strings of memory cells consecutive along said second direction are spaced apart from each other of a pitch;
forming a source region at the second end of the strings of memory cells;
forming, between pairs of said rows of strings of memory cells consecutive along said second direction, a slit extending in said third direction from said first end to said source region, wherein said slit has size, along said second direction, less, equal or greater than said pitch sufficient for the formation, in said slit, of an electrical contact to the source region;
forming said electrical contact to the source region;
wherein said slit has size, along said second direction, substantially equal to said pitch of the rows of strings of memory cells consecutive along said second direction.

2. The method of claim 1, wherein:
said forming a plurality of rows of strings of memory cells comprises forming strings of memory cells having a size along said second direction;
said forming, between pairs of said rows of strings of memory cells consecutive along said second direction, a slit comprises slicing and removing portions of the strings of memory cells, said sliced and removed portions extending along said third direction from said first end to said source region and having length along said second direction less, equal or greater than half of said size of the strings of memory cells in said second direction.

3. The method of claim 2, wherein:
said sliced and removed portions extend along said second direction of a length substantially equal to said pitch of consecutive rows of memory cell strings which are consecutive along said second direction.

4. The method of claim 1, wherein:
said forming a plurality of rows of strings of memory cells comprises realizing substantially cylindrical strings of memory cells with an axis along said third direction, and
said forming a slit between pairs of said consecutive rows of strings of memory cells which are consecutive along said second direction creates strings of memory cells with a shape of a portion of a cylinder, preferably a semi-cylindrical shape.

* * * * *